US011935601B2

(12) United States Patent
Lu et al.

(10) Patent No.: US 11,935,601 B2
(45) Date of Patent: Mar. 19, 2024

(54) BIT LINE SENSING CIRCUIT COMPRISING A SAMPLE AND HOLD CIRCUIT

(71) Applicant: SuperMem, Inc., San Diego, CA (US)

(72) Inventors: Yu Lu, San Diego, CA (US); Chieh-yu Lin, San Diego, CA (US)

(73) Assignee: SuperMem, Inc., San Diego, CA (US)

( * ) Notice: Subject to any disclaimer, the term of this patent is extended or adjusted under 35 U.S.C. 154(b) by 0 days.

(21) Appl. No.: 17/635,319

(22) PCT Filed: Aug. 14, 2020

(86) PCT No.: PCT/US2020/046506
§ 371 (c)(1),
(2) Date: Feb. 14, 2022

(87) PCT Pub. No.: WO2021/030750
PCT Pub. Date: Feb. 18, 2021

(65) Prior Publication Data
US 2022/0399060 A1 Dec. 15, 2022

Related U.S. Application Data

(60) Provisional application No. 63/017,535, filed on Apr. 29, 2020, provisional application No. 62/894,746, (Continued)

(51) Int. Cl.
G11C 16/28 (2006.01)
G11C 16/08 (2006.01)
(52) U.S. Cl.
CPC ............. G11C 16/28 (2013.01); G11C 16/08 (2013.01)

(58) Field of Classification Search
CPC .......... G11C 16/24; G11C 16/26; G11C 16/08
See application file for complete search history.

(56) References Cited

U.S. PATENT DOCUMENTS 6,760,266 B2    7/2004  Garni et al.
6,870,774 B2 *  3/2005  Roohparvar ......... G11C 7/1027
                                                365/185.33
(Continued)

FOREIGN PATENT DOCUMENTS

TW    1485715    5/2015
TW    1600019    9/2017

OTHER PUBLICATIONS

Demler, "Mythic multiples in a flash," Microprocessor Report (2018).
(Continued)

Primary Examiner — Kretelia Graham
(74) Attorney, Agent, or Firm — MORRISON & FOERSTER LLP

(57) ABSTRACT

Memories, memory controllers, and computing systems and their methods of operation are disclosed. In some embodiments, a method of accessing a memory includes accessing a first bit line corresponding to a sense amplifier and accessing a second bit line corresponding to the sense amplifier. In some embodiments, a memory controller includes a second memory configured to store data of a second data type. In some embodiments, a method includes operating a memory in a second mode in response to receiving an input to change the operation of the memory from a first mode to the second mode.

11 Claims, 11 Drawing Sheets

Related U.S. Application Data filed on Aug. 31, 2019, provisional application No. 62/886,836, filed on Aug. 14, 2019.

(56) References Cited

U.S. PATENT DOCUMENTS

| | | | |
|---|---|---|---|
| 7,116,576 B2* | 10/2006 | Smith | G11C 13/004 |
| | | | 365/158 |
| 7,969,800 B2 | 6/2011 | Yun et al. | |
| 8,537,606 B2 | 9/2013 | Kim et al. | |
| 8,576,617 B2 | 11/2013 | Zhu et al. | |
| 8,988,954 B2 | 3/2015 | Chong et al. | |
| 9,275,714 B1 | 3/2016 | Kim et al. | |
| 9,368,178 B2* | 6/2016 | Kim | G11C 11/1659 |
| 10,170,181 B2* | 1/2019 | Jo | G11C 13/004 |
| 2003/0214861 A1* | 11/2003 | Takano | G11C 7/1021 |
| | | | 365/200 |
| 2005/0276147 A1 | 12/2005 | Shimbayashi | |
| 2008/0285360 A1 | 11/2008 | Sakimura et al. | |
| 2013/0132685 A1* | 5/2013 | Vogelsang | G06F 13/1694 |
| | | | 711/154 |
| 2016/0189761 A1 | 6/2016 | Noguchi et al. | |
| 2018/0260127 A1 | 9/2018 | Shirota et al. | |
| 2018/0364919 A1 | 12/2018 | Hall et al. | |
| 2019/0042160 A1 | 2/2019 | Kumar et al. | |
| 2019/0087932 A1 | 3/2019 | Baek | |
| 2019/0096453 A1 | 3/2019 | Shin et al. | |

OTHER PUBLICATIONS

Everspin DDR3-STTRAM datasheet (2018).
Khvalkovskiy et al., "Basics principles of the STT-MRAM cell operation in memory arrays," J Phys D (2013) 35 pages.
Kim et al., A case for exploiting subarray-level parallelism (SALP) in DRAM, ISCA (2012).
Mittal, "A survey of soft-error mitigation techniques for non-volatile memories," Computers (2017).
O'Connor et al., "Fine-grained DRAM: Energy-efficient DRAM for extreme bandwidth systems," Mirco (2017).
Lee et al., "Embedded STT-MRAM in 28-nm FDSOI logic process for industrial MCU/IoT application" In2018 IEEE Symposium on VLSI Technology (2018) (pp. 181-182). IEEE.

* cited by examiner

BIT LINE SENSING CIRCUIT COMPRISING A SAMPLE AND HOLD CIRCUIT

CROSS REFERENCE TO RELATED APPLICATIONS

This application is a national stage application under 35 U.S.C. § 371 of International Application No. PCT/US2020/046506, filed internationally on Aug. 14, 2020, which claims priority from U.S. Provisional Application No. 62/886,836, filed Aug. 14, 2019, entitled "MEMORY ARRAY CIRCUIT AND METHOD OF READ OPERATION," from U.S. Provisional Application No. 62/894,746, filed Aug. 31, 2019, entitled "MEMORY WITH MULTIPLE OPERATING MODES," and from U.S. Provisional Application No. 63/017,535, filed Apr. 29, 2020, entitled "MEMORY CONTROLLER DEVICE, A SYSTEM INCLUDING THE SAME AND ASSOCIATED METHOD," the contents of which are incorporated herein by reference in their entireties.

FIELD

This disclosure generally relates to computing memory. More specifically, this disclosure relates to devices and methods for computing memory systems.

BACKGROUND

Magnetic-Random-Access-Memory (MRAM), Phase-Change-Memory (PCM), Resistive-Random-Access-Memory (RRAM), and Ferroelectric-Random-Access-Memory (FRAM) are examples of non-volatile memory technologies that may have faster programming and higher re-write endurance. For example, high performance MRAM may be used in edge-AI applications, which may require complex data structures after model optimization.

To achieve high performance (e.g., similar performance to dynamic random-access memory (DRAM)), a number of unique circuit challenges exist for non-volatile memories like MRAM. For example, due to limitations (e.g., lower read margin, more device variation, on-off ratio from tunnel magnetoresistance ratio, parasitic resistance, read-disturb errors) associated with a MRAM bitcell (e.g., a 1T1J MRAM bitcell), MRAM sensing circuits may need to be more precise than DRAM, meaning MRAM sensing circuits can be more complex and/or occupy more area.

As a specific example, a MRAM sensing circuit may require 32 or 64 bit line pitch width, compared to a two bit line pitch width for a DRAM sensing circuit. This may limit an existing 1 MB MRAM having 4096 bit lines design to read no more than 64 bit lines in parallel at once (i.e., there are 64 sensing circuits, and each sensing circuit can read one bit at once). If bit line signal development takes 10-15 ns and 2-bit ECC calculations take 5 ns or more, a read operation cycle time of 20-25 ns or 0.4 GB/s per 1 MB array would be required, which is inferior to DRAM performance and may be insufficient for systems such as AI, neural networks, and machine learning. Furthermore, MRAM read circuits may consume a large amount of power to activate row decoders and to generate accurate reference signals for each read cycle. Therefore, it may be desirable to improve MRAM read performance and power.

A memory controller is a circuit used to coordinate memory requests from at least one host (e.g., CPU, GPU, DSP, ASIC) and to issue commands to a memory circuit. These memory requests may include requests for data that changes frequently (e.g., dynamic data) and data that change less frequently (e.g., static data). In some instances, requests for static data reduces bandwidth for dynamic data, reducing system performance. For example, the memory controller a DRAM controller, and requests for dynamic data and static data are made to the DRAM controller controlling a same DRAM array, reducing bandwidth for dynamic data. In systems such as a neural network, where a large amount (e.g., TB) of training data (e.g., dynamic data) needs to be sent to the processor as quickly as possible, requests for static data (e.g., from the same DRAM array that stores the dynamic data) through the DRAM controller would slow down traffic associated with the training data.

DRAM devices generally use page mode access (e.g., JEDEC standards), in which DRAM array cells on a same word line are read together. However, in some instances of page mode access, up to 90% of data on an activated page is not used, causing long latency associated with reading a small amount of data. Memory controller optimization is a traditional solution to reduce unused data and latency, but optimization results are limited due to fixed page sizes and boundaries. Furthermore, to reduce interface bandwidth requirements, neural networks uses complex data structures (e.g., mixed word length, pruning, compression techniques) that reduces effectiveness of DRAM due to its fixed page mode. More generally, modern computation tasks may be hindered by time and energy costs of transferring data between the computing chips and memory chips, each of the chips having a dedicated mode of operation; in these scenarios, it may be more difficult to improve the computing chip-memory chip interface to increase performance.

SUMMARY

Memories, memory controllers, and computing systems and their methods of operation are disclosed. In some embodiments, a method of accessing a memory includes accessing a word line of a memory array, while accessing the word line of the memory array, accessing a first bit line corresponding to a sense amplifier and accessing a second bit line corresponding to the sense amplifier; and sensing, with the sense amplifier, a first memory bitcell of the memory array at the word line and the first bit line. Thus, memories configured to perform the disclosed methods provide faster data access at lower power consumption.

In some embodiments, a memory controller includes a first interface configured to communicate with a host, a second interface configured to communicate with a first memory of the host, the first memory of the host configured to store a first data type, a controller, coupled to the first interface and the second interface, configured to issue commands to the first memory of the host, a second memory configured to store a second data type different from the first data type, a first data buffer coupled to the first interface and the second interface and configured to transfer data of the first data type between the first interface and the second interface, and a second data buffer, coupled to the second memory and the first interface and configured to transfer data of the second data type between the first interface and the second memory. Thus, memory controllers provide faster access to data of the first data type.

In some embodiments, a method includes operating a memory in a first mode, the first mode comprising at least one of a page mode, a random-access mode, and a streaming mode, receiving, while operating in the first mode, an input to change the operation of the memory to a second mode different from the first mode, the second mode comprising at least one of the page mode, the random-access mode, and the streaming mode, and in response to receiving the input to change the operation of the memory from the first mode to the second mode, operating the memory in the second mode. Thus, memories configured to perform the disclosed methods provide more flexibility for diverse types of applications. For example, a same memory performing the disclosed methods would be suitable for both a first application requiring the memory to be in a first mode and a second application requiring the memory to be in a second mode.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Figure 1:
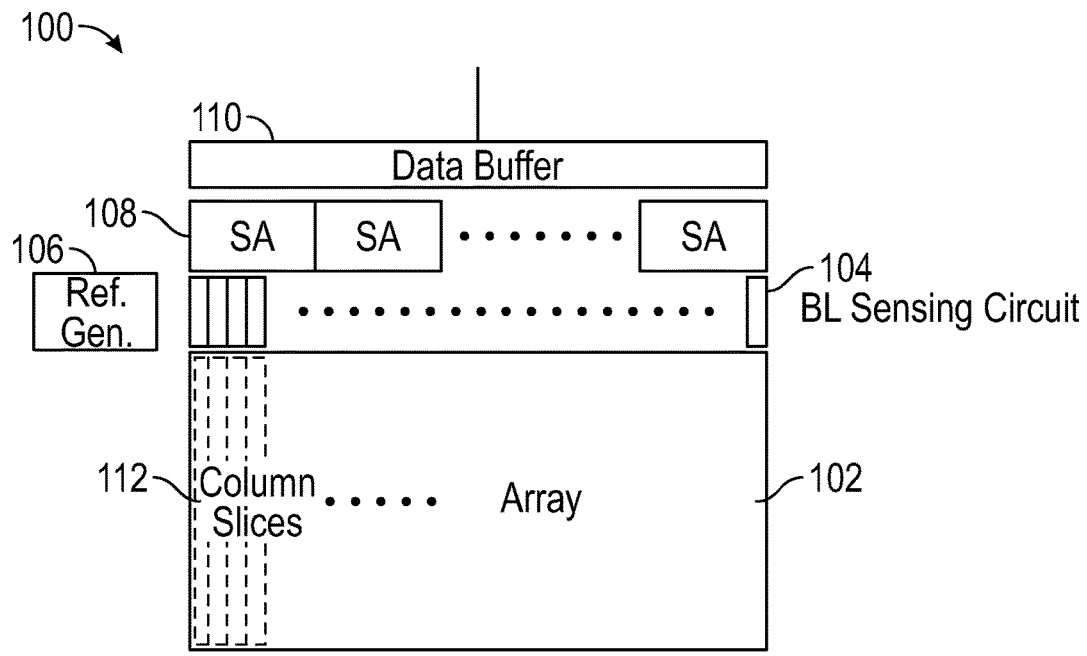
FIG. 1 illustrates an exemplary memory, in accordance with an embodiment.

FIG. 1 illustrates an exemplary memory 100, in accordance with an embodiment. In some embodiments, the computing memory 100 comprises a memory array 102, bit line sensing circuits 104, a reference generator 106, sense amplifiers 108, and data buffers 110.

In some embodiments, the computing memory 100 is included in at least one of an edge-AI system, a neural-network system, an internet-of-things system, an automotive electronics system, microcontroller system, a mobile communication system, a programmable computing system, a hardware security system, a telematics system, a biomedical electronics device, a robot, and a drone.

In some embodiments, the memory array 100 comprises an array of resistive memory bitcells. For example, the resistive memory bitcell is MRAM). In some embodiments, the memory array 100 comprises an array of charged-based memory such as static random-access memory (SRAM), DRAM, and/or one-transistor-one MTJ bitcells. In some embodiments, the memory array 100 comprises at least one of SRAM, RRAM, FRAM, flash memory, and PCM. It is understood other types of memory, not expressively described herein, may be included in the disclosed computing memories. Although one memory array is illustrated, it is understood that the computing memory 100 may include more than one memory array.

In some embodiments, the memory array 100 is arranged in rows or word lines and columns or bit lines. As used herein, "a column" or "a bit line" is a plurality of bitcells included in a memory array, arranged along a first dimension of the array, and bounded by boundaries of the array. Each bitcell of the plurality of bitcells belongs to a unique row along a second dimension of the array.

In some embodiments, the memory array 100 is divided into "column slices" (e.g., column slices 112). A column slice may comprise a group of bit lines associated with a bit line sensing circuit (e.g., bit line sensing circuit 104, bit line sensing circuit 204). Although the column slice is illustrated as shown, it is understood that all bit lines of a column slice may not be adjacent to each other or column slices of a computing array may not be equally sized. As described herein, the methods and computing memories described herein enable more than one bit line of a column slice to be advantageously accessed during a read cycle.

As an example, a 1 MB (8192 Kbits) computing memory comprises a memory array with 2048 word lines and 4096 bit lines. In this exemplary design, a bit line sensing circuit 104 has a pitch (e.g., width) of 4 bit lines and a sense amplifier 108 has a pitch (e.g., width) of 64 bit lines (or 16 bit line sensing circuits). That is, the exemplary computing memory has 256 bit line sensing circuits and 64 sense amplifiers. In some embodiments, the exemplary computing memory has at least 1024 data buffers (e.g., to store at least 1024 bits of data outputs per read cycle). In some embodiments, first multiplexers (MUX) (e.g., associated with BLEN1<i> signals in FIG. 2, associated with bit line enable signal 306 in FIG. 3) interface between the memory array and the bit line sensing circuits, and second MUXs (e.g., associated with BLEN2<j> signals in FIG. 2) interface between the bit line sensing circuits and the sense amplifiers. In the exemplary 1 MB computing memory, a 4-to-1 MUX (e.g., BLEN1<i>=[BLEN1<0> . . . BLEN1<3>]) would interface every 4 bit lines with one bit line sensing circuit, and a 16-to-1 MUX (e.g., BLEN2<j>=[BLEN2<0> . . . BLEN2<15>]) would interface every 16 bit line sensing circuits with one sense amplifier.

In some embodiments, the selective electrical coupling of a bit line to a bit line sensing circuit (e.g., one of the BLEN1<i> signals selects a bit line in each column slice) and the selective electrical coupling of a bit line sensing circuit to a sense amplifier (e.g., the BLEN2<j> signals select a bit line sensing circuit at a particular time) are based on a column address of an address (e.g., the address is decoded, the address is latched and decoded) received by the computing memory. In some embodiments, a bitcell on each selected bit line corresponding to a selected word line based on a row address of an address (e.g., the address is decoded, the address is latched and decoded) is accessed. As described herein, in some embodiments, each of the selected bitcell forms a current path with a corresponding bit line sensing circuit and a bit line voltage is developed; the bit line voltage is indicative of the state of the accessed bitcell (e.g., the state of the data stored in the bitcell).

Although a computing memory having specific memory array dimensions and number of elements (e.g., bit line sensing circuits, sense amplifiers, data buffers, memory array(s)) is described, it is understood that the array dimensions and the number of elements are merely exemplary. It is understood that the computing memory may have any memory array dimension and any number of elements. For example, the computing memory can include more than one memory array, additional or less corresponding bit line sensing circuits, additional or less sense amplifiers, additional or less array access decoding (e.g., word line decoders, MUXs), and additional or less data buffer storage. As another example, in some embodiments, there is one bit line per bit line sensing circuit. Therefore, in these embodiments, a MUX between a bit line and a corresponding bit line sensing circuit would not be needed. As another example, in some embodiments, there is one bit line sensing circuit per sense amplifier. Therefore, in these embodiments, a MUX between a bit line sensing circuit and a corresponding sense amplifier would not be needed.

In some embodiments, as described herein, more than one bit line corresponding to a sense amplifier (e.g., more than one bit line sensing circuit is electrically coupled to a same sense amplifier) can be accessed during a same cycle. That is, a sense amplifier may advantageously sense more than one bit line during a read cycle. A read cycle may be a period associated with a unit operation associated with a specific command (e.g., read) from a host (e.g., at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor). After a read cycle, the memory circuit is ready to accept another command (e.g., another read command, a write command). For example, in some embodiments, a read cycle includes at least some of the following: receiving a read command and address (C&A) from a host, decoding C&A and selecting a corresponding bank or array, activating a corresponding word line decoder and selecting a corresponding word line, activating a read circuits and retrieving data from bit cells, sending the data from a sense amplifier to a memory interface, and sending the data to the host (e.g., through the BUS). Computing memories for accessing more than one bit line of a column slice during a same cycle and methods of operating the computing memories are disclosed in more detail herein.

Although the bit line sensing circuits are described as being electrically coupled to sense amplifiers and advantages of the disclosed computing memories are described with respect to sense amplifiers, it is understood that the term "sense amplifier" is not meant to be limiting, and can mean any circuit or hardware that is configured to receive a bit line voltage and generate a data output corresponding to an accessed bitcell associated with the bit line voltage.

As an exemplary advantage, read operation may be sped up by accessing more than one bit line corresponding to a sense amplifier during a same cycle, compared to memories that access only one bit line for each sense amplifier during a same cycle. For example, by allowing access to at least one bit line corresponding to a sense amplifier during a same cycle, the disclosed computing memory may allow more than one bit line voltage to concurrently settle (e.g., a second bit line voltage is allowed to settle or develop while a first bit line voltage is still settling or developing) and be subsequently sensed, reducing an amount of time required to access the second data (which may be a timing or performance bottle neck) and beyond.

The computing memory may advantageously achieve more than 4-32 times the bandwidth, compared to a memory that accesses one bit line for each sense amplifier during a same cycle, allowing memories such as MRAM to be more suitable for applications such as AI, neural networks, and machine learning. For example, the disclosed computing memory may achieve an output bandwidth of greater than 7 GB/s for each MB of density. By allowing more data to be accessed at one time with the disclosed computing memories and methods of operating the computing memories, a more cost-effective LPDDR4-MRAM chip may be designed to meet JEDEC standard timing specifications, such as tRCD, without reducing total page size (e.g., number of memory banks times page size), increasing power to accommodate reduced page size, and decreasing memory density. As a comparison, a memory accessing one bit line for each sense amplifier per cycle may require a four times page size reduction (hence using four times more power) to achieve a tenth of the required speed for JEDEC tRCD specification.

For example, in some embodiments, all the memory arrays of a 128 MB MRAM chip may operate at a total bandwidth of 900 GB/s, which is a higher bandwidth than fast DRAM interfaces (e.g., High Bandwidth Memory or HBM3). By being able to operate at higher speeds, the disclosed computing memory may reduce power consumption by more easily meeting performance requirements and may allow the computing memory to be configured for different operating modes or more flexible access modes, as described herein.

In some embodiments, the bit line sensing circuits 104 are configured to sense a bit line electrically coupled (e.g., a BLEN1<i> signal selects a bit line of a group of bit lines to electrically couple to the bit line sensing circuit) to the bit line sensing circuit 104. For instance, the bit line sensing circuit 104 is configured to sense, capture, or generate (e.g., a voltage, a current) a signal associated with a state (e.g., 1, 0, high, low, a state of a multi-state memory) of a memory bitcell (e.g., the data in the accessed bitcell that was previously written into the bitcell) associated with a bit line that is being sensed.

In some embodiments, one bit line sensing circuit 104 is associated with more than one bit line and a multiplexer electrically couples a selected bit line (e.g., a BLEN1<i> signal selects a bit line of a group of bit lines to electrically couple to the bit line sensing circuit, based on a received address) to the bit line sensing circuit to sense the selected bit line. For example, in the example of the 2048 word lines×4096 bit lines memory, each bit line sensing circuit 104 may be selectively electrically coupled to one of four bit lines. Based on a received address, a multiplexer would select one of the four bit lines corresponding to the address.

As an example, if a bitcell at the $7^{th}$ word line of the 2048 word lines (e.g., a word line enable signal associated with the $7^{th}$ word line turns on an access transistor of the bitcell connected to the word line) and the $3^{rd}$ bit line of a group of four bit lines is being accessed, the bit line sensing circuit 104 would be electrically coupled to this bitcell through the $3^{rd}$ bit line (e.g., the BLEN1<2> signal selects the $3^{rd}$ bit line of the group of four bit lines to electrically couple to the bit line sensing circuit) and sense, capture, or generate a signal associated with the state of this bitcell.

For example, if the data stored in the bitcell is a "1" or high, a voltage above a reference voltage would be generated after the bit line voltage settles or develops, and if the data stored in the bitcell is a "0" or low, a voltage below a reference voltage would be generated after the bit line voltage settles or develops. After the corresponding word line and corresponding bit line are accessed, the bitcell is electrically coupled to the bit line sensing circuit 104 through the corresponding bit line, the bit line voltage begins to settle or develop, and the settling or developed voltage depends on an effective signal value (e.g., resistance) of the memory bitcell (e.g., MRAM bitcell), which corresponds to the state of the bitcell data.

For instance, if the state of the bitcell is "1" or high, the effective resistance is higher and hence, the settled or developed voltage would be higher (e.g., a developed voltage is higher), and if the state of the bitcell is "0" or low, the effective resistance is lower and hence, the settled or developed voltage would be lower (e.g., a developed voltage is lower) because a same current traverses the bitcell from the bit line sensing circuit.

In some embodiments, a developed bit line voltage of 0.3-0.4V is associated with a "1" or high state of a bitcell, and a developed bit line voltage of 0.20-0.35V is associated with a "0" or a low state of a bitcell. In some embodiments, generally for MRAM, a voltage associated with a "1" or high and "0" or low state of a bitcell depends on the magnetic tunnel junction of the bitcell and a current (e.g., from the bitline sensing circuit) traversing the bitcell. For example, a voltage difference between a voltage associated with a "1" or high state of a bitcell and a voltage associated with a "0" or low state of a bitcell is $\frac{1}{20}$-$\frac{1}{5}$ of a common mode voltage (e.g., an average voltage between a high bit line voltage and a low bit line voltage, a reference voltage).

It is understood that, in some embodiments, the bitcell data and the data's corresponding signal sensed, captured, or generated in the bit line sensing circuit may have a different relationship (e.g., a "1" corresponds to a lower signal value, a "0" corresponds to a higher signal value) without departing from the scope of the disclosure.

In some embodiments, effective signal values (e.g., resistance, impedance, charge, output voltage) of a bitcell indicate respective states (e.g., data stored) of the first memory bitcell and the second memory bitcell. For example, the effective signal value is a resistance or impedance and a current is applied to the bitcell, a voltage is outputted, and the voltage indicates the state of the bitcell because the state of the bitcell is associated with a resistance or an impedance value. As another example, the effective signal value is a charge stored in the bitcell, and amount of charge indicates the state of the bitcell.

In some embodiments, a bit line sensing circuit 104 comprises a sample and hold circuit that is configured capture a settled or developed bit line voltage associated with the state of the accessed bit cell. An exemplary sample and hold circuit used in some embodiments of the bit line sensing circuit 104 will be described in more detail with respect to FIG. 4. In some embodiments, a charge injection reduction circuit, described in more detail herein, is coupled to the sampling capacitor of the sample and hold circuit to reduce charge injection and increase accuracy of the settled or developed bit line voltage being held. In some embodiments, offset calibration of the bit line sensing circuit is not required, allowing an area of the bit line sensing circuit to be smaller than a sense amplifier (and advantageously allowing more bit line sensing circuits to be sensed by a same sense amplifier during a read cycle), which may require offset calibration to enable more accurate data outputs.

In some embodiments, while a first bit line voltage is settling or developing in a first sensing circuit 104, a second bit line voltage is also settling or developing in a second sensing circuit 104. In some embodiments, the settled or developed bit line voltages for each of the respective bit lines are held (e.g., using a sample and hold circuit), and a sense amplifier corresponding to the bit lines senses and amplifies each of the held settled or developed bit line voltages, one at a time, to create data outputs associated with each of the access bitcells during a read cycle.

As an exemplary advantage, by accessing at least one bit line corresponding to a sense amplifier during a same cycle and holding the bit line voltages before they could be sensed, read operation may be sped up, compared to memories that access one bit line of a column slice during a same cycle. For example, by allowing access to at least one bit line corresponding to a sense amplifier during a same cycle, the disclosed computing memory may allow more than one bit line voltage to concurrently settle (e.g., a second bit line voltage is allowed to settle or develop while a first bit line voltage is still settling or developing), reducing an amount of time required to access the second data (which may be a timing or performance bottle neck) and beyond.

Although an operation of the bit line sensing circuit is described with specific examples, it is understood that the bit line sensing circuit may sense, capture, or generate a bit cell state-dependent signal using other methods without departing from the scope of the disclosure.

In some embodiments, the reference generator 106 is configured to generate a reference signal used to distinguish between states of an accessed bitcell. In some embodiments, the reference generator 106 generates a reference voltage between a settled or developed voltage associated with a first state (e.g., a "1") and a settled or developed voltage associated with a second state (e.g., "0"). For example, if the data stored in the bitcell is a "1," a settled or developed bit line voltage is a higher voltage, and if the data stored in the bitcell is a "0," a settled or developed bit line voltage is a lower voltage, then the generated reference voltage would be a voltage between the higher voltage and the lower voltage. The generated reference voltage is used as a threshold to determine the state of the accessed bitcell based on the settled or developed bit line voltage's comparison with the generated reference voltage.

In some embodiments, the reference generator 106 generates the reference signal by using a reference cell. In some embodiments, the reference cell is configured to generate a signal value between a signal value associated with a first state of a bitcell (e.g., a settled or developed bit line voltage associated with a "1") and a signal value associated with a second state (e.g., a settled or developed bit line voltage associated with a "0") of a bit cell. For example, if the first state of the bitcell is associated with a first effective resistance and the second state of the bitcell is associated with a second effective resistance, then an effective resistance of the reference cell is between the first effective resistance and the second effective resistance to generate the signal value between a signal value associated with a first state of a bitcell and a signal value associated with a second state. In some embodiments, the reference generation signal is generated by averaging more than one signals generated by an equal number of cells representing the first state and cells representing the second state. In some embodiments, the reference signal is generating using a bit line sensing circuit (e.g., bit line sensing circuit 104, bit line sensing circuit 204, bit line sensing circuit 404) electrically coupled to a reference cell (e.g., in lieu of a bitcell).

In some embodiments, more than one bit line corresponding to a sense amplifier is accessed during one read cycle (e.g., more than one bitcell on word line in at least one column slice is accessed); the generated reference signal is used for more than one bit line of comparison (e.g., more than one group of bit lines being sensed by the sense amplifiers).

In some embodiments, after the reference signal is generated (e.g., the reference voltage has been generated using the reference cell), the reference signal is held and circuitry generating the reference signal is deactivated (e.g., a current through the reference cell in the reference generator, generating the reference signal, is turned off). For example, the reference signal is sampled, held, or stored. In some embodiments, the reference signal (e.g., voltage) is held using a capacitor. For example, the capacitor samples the reference voltage and maintains the reference voltage level without additional power consumption. In some embodiments, a charge injection reduction circuit, described in more detail herein, is coupled to the capacitor sampling the reference voltage to reduce charge injection and increase accuracy of the reference voltage being held.

As an exemplary advantage, power consumption of the computing memory is reduced by deactivating the reference generator after the reference signal is generated. For example, by sharing the held reference signal during the sensing of the bit lines corresponding to a sense amplifier during a cycle, reference generation power is reduced for sensing of the second bit line and beyond, compared to a memory that accesses one bit line for each sense amplifier per cycle, which requires reference generation power consumption every time a bit line is accessed. As an example, the disclosed reference generation scheme advantageously reduces read power per data output by more than four times, compared to a memory that accesses one bit line for each sense amplifier per cycle.

Although one reference generator is illustrated in the disclosed computing memories, it is understood that the disclosed computing memories may include more than one reference generator without departing from the scope of the disclosure. For example, to advantageously better track process variations, a first reference generator may electrically couple to a first group of sense amplifiers and provide a reference signal for the first group of sense amplifiers, and a second reference generator may electrically couple to a second group of sense amplifiers and provide a reference signal for the second group of sense amplifiers.

In some embodiments, the sense amplifier 108 is configured to amplify an input and outputs the amplified input (e.g., data output 218, data output 312, data output 508). In some embodiments, the input is a difference between a bit line signal (e.g., a settled or developed bit line voltage from the bit line sensing circuit 104) and a reference signal (e.g., a reference voltage from the reference generator 106), and the output is a data output, which is an amplified difference between the bit line signal and the reference signal. In some embodiments, the data output more strongly indicates (e.g., the voltage of the data output is farther away from the reference voltage, compared to the developed bit line voltage) a state of the accessed bitcell (e.g., "1," "0") associated with the accessed bit line.

In some embodiments, one sense amplifier 108 is associated with more than one bit line sensing circuit 104 and a multiplexer electrically couples a selected bit line sensing circuit (e.g., a bit line sensing circuit is selected using the BLEN2<j> signal) to the sense amplifier to sense a bit line voltage from the selected bit line sensing circuit. For example, in the example of the 1 MB computing memory having 2048 word lines×4096 bit lines, each sense amplifier 108 may be selectively electrically coupled to one of 16 bit line sensing circuits 104 at one time (e.g., so the sense amplifier can sense each bit line voltage from all 16 bit line sensing circuits at different times of a same read cycle).

As an exemplary advantage, by multiplexing the bit line sensing circuits and selectively electrically coupling each one to a sense amplifier, more than one bit line corresponding to a sense amplifier during a same cycle may be sensed (e.g., in a pipeline fashion), and read operation may be sped up, compared to memories that access one bit line for each sense amplifier during a same cycle.

In some embodiments, the data buffer 110 is configured to receive data outputs (e.g., data output 218, data output 312, data output 508) from a sense amplifier, store the data outputs, and output requested data (e.g., to a host, to a memory interface). In some embodiments, the data buffer 110 is configured to store a multiple of the product of [number of sense amplifiers] (e.g., k, as described with respect to FIG. 2.) and [number of column slices associated with a sense amplifier] (e.g., j, as described with respect to FIG. 2). For example, in the 1 MB memory example, the data buffer 110 is configured to store a multiple of 256 bits in a read cycle. In some embodiments, the data buffer 110 is coupled to a tag register (e.g., tag register 216) or comprises the tag register; the tag register sets a tag bit associated with a data output to indicate whether the data output is ready to be accessed (e.g., by a host, by a processor, by a system, by a memory controller).

In some embodiments, the computing memory receives a memory address and in accordance with a determination that the memory address is associated with a stored data output (e.g., the stored data output is associated with the data stored in the bitcell at the memory address that had been sensed by the sense amplifier) in the data buffer 110, the data buffer 110 outputs the data output to a requestor (e.g., a host, a processor, a system, a memory controller).

In some embodiments, the data buffer 100 include latches, and storing the data outputs comprises latching the data outputs. The data buffer 110 advantageously stores data associated with more than one bit line corresponding to a sense amplifier during a read cycle, forming a data pipeline and allowing a requestor (e.g., a host, a processor, a system, a memory controller) to more quickly access the computing memory and/or access more data at one time.

In some embodiments, as soon as the sense amplifier finishes outputting a data output, the data buffer 110 is configured to store the data output. Advantageously, before all of the bit line sensing circuits are sensed and if requested, the data buffer may output the stored data, allowing data to be read earlier (e.g., before completion of a read cycle). For example, the data buffer 110 allows data to be read earlier in a preemptive column mode, which will be described in more detail.

Figure 2:
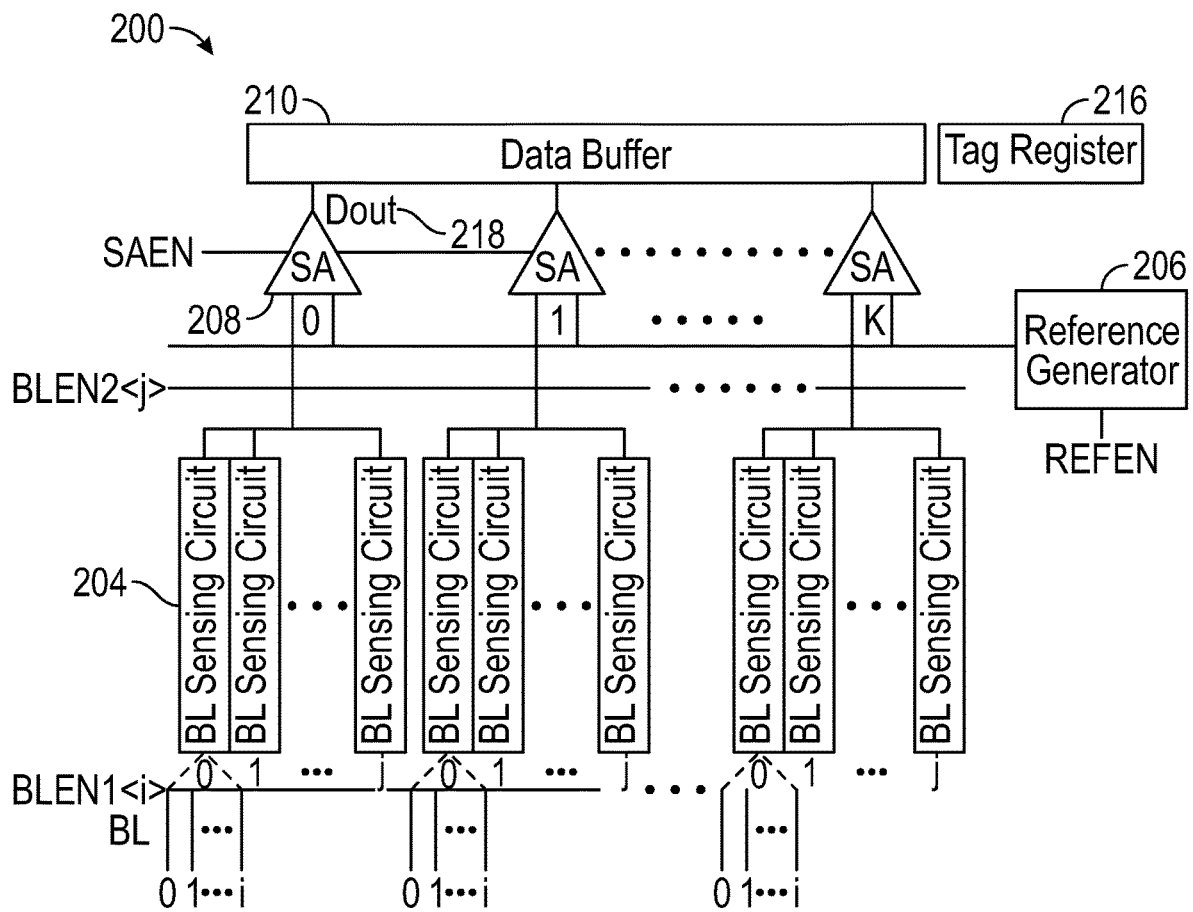
FIG. 2 illustrates an exemplary memory, in accordance with an embodiment.

In some embodiments, the total data buffer size (e.g., number of bits all of the data buffers 110 or data buffers 210 can store) is a multiple of the product of [number of sense amplifiers] (e.g., k, as described with respect to FIG. 2.) and [number of column slices associated with a sense amplifier] (e.g., j, as described with respect to FIG. 2). In the 1 MB computing memory example, there would be 64 sense amplifiers associated with a memory array (because 4096 bit lines=64 sense amplifiers×64 bit line pitch/sense amplifier; k=64), and each sense amplifier is associated with 16 bit line sensing circuits (j=16). A total data buffer size of the 1 MB computing memory would be a multiple of 64×16=1024 bits (e.g., the data buffer can store a multiple of 1024 bits per read cycle).

In the 1 MB example, if the read pipeline depth is 16, meaning one bit line in each of the 16 column slices is accessed in a read cycle, each sense amplifier would output 16 bits in each read cycle, and the 64 sense amplifiers in the 1 MB computing memory would output 1024 bits per read cycle. This means the data buffer may need to have a size of 1024 or larger to sufficiently store all the accessed data in a read cycle.

The read pipeline depth can be increased by cycling through more bit lines within the column slice. As another example, in the same 1 MB memory, if the read pipeline depth is a multiple of 16 greater than 16, meaning more than one bit line in each column slice is accessed in a read cycle, each sense amplifier would output this multiple of 16 bits in each read cycle, and the 64 sense amplifiers in the 1 MB computing memory would output a multiple of 1024 bits per read cycle. This means the data buffer may need to have a size of multiple of 1024 or larger to sufficiently store all the accessed data in a read cycle.

In some embodiments, a data buffer includes latches to store the data outputs, and each latch may be bigger than a bit line width. Therefore, in some embodiments, to optimize the physical area of the data buffers 110 or data buffers 210, the data buffers are configured to store a number of bits smaller than a total number of bit lines. For example, in the 1 MB memory example, to optimize memory area, it may be desirable for the data buffers to store less than 4096 bits (e.g., so the width of the data buffers would be less than the width of the 4096 bit lines in the 1 MB memory).

In some embodiments, the size of the data buffer relates to the page size parameter (e.g., as described with respect to computing memory 1300). In some examples, a page size range from 4-16 Kbit, and for MRAM arrays, a page may be formed with multiple arrays of smaller sizes, for example 4-16 1 MB arrays, a data buffer having an optimal area (e.g., the width of the data buffers is less than the width of the memory array) may be used.

As a specific example, for the example 2048 word lines× 4096 bit lines 1 MB array (i.e., 8192 Kbits), an example of a read cycle includes decoding and selecting one of the 2048 word lines. Then, bit line sensing circuits (e.g., bit line sensing circuit 104, bit line sensing circuit 204) associated with each sense amplifier begin to allow bit line voltages to develop (e.g., there are 64 bit line sensing circuits working at this time). After a brief delay (e.g., a fraction (e.g., 1/16) of the time needed to settle the bit line voltage, tCLK in FIG. 3), a next group of 64 bit line sensing circuits begin to allow their respective bit line voltage to develop (e.g., while the first group of 64 bit line sensing circuits continue to develop their respective bit line voltages) and so on (e.g., until all desired bit lines are accessed). When the first group of bit line voltage are developed and ready for sensing (e.g., amplification), they will be passed to the 64 sense amplifiers. After a brief delay (e.g., a fraction (e.g., 1/16) of the time needed to settle the bit line voltage, tCLK in FIG. 3, a time needed for the sense amplifier to generate an amplified output), the sense amplifiers generate data outputs (e.g., the amplified signals) and send the data outputs to the data buffers, and the data buffers store (e.g., latch in) the 64 bits of data outputs. The bit line voltages of the second group of 64 bit line sensing circuits have developed, and the bit line voltages are provided to the same 64 sense amplifiers for sensing (e.g., amplification). The second group of 64 data outputs associated with the second group of bit lines are also stored (e.g., latched) in the data buffers. These steps repeat for subsequent groups of bit lines until a desired number of bit line sensing circuits (e.g., all 16 bit line sensing circuits associated with each of the 64 sense amplifiers) have accessed their corresponding bit cells and 64 (i.e., number of sense amplifiers)×16 (i.e., number of bit line sensing circuits per sense amplifier) or 1024 bits have been latched onto the data buffer.

In some embodiments, the total time needed for access is estimated as follows. A time required for word line decoding and selecting the word line can be called $t_0$, which may be 1-2 ns. A time required for a bit line voltage in a bit line sensing circuit to develop can be called $t_1$ (e.g., pulse width of bit line enable signal 306), which may be 10-20 ns for MRAM. A time needed for a sense amplifier to amplify the bit line voltage and for a data buffer to latch in the data output can be called $t_2$, which may be 1-2 ns. The first group of data associated with the first group of bit line sensing circuits (e.g., the first group of 64 bits in the above example) will be stored into the data buffers in about $t_0+t_1+t_2$ after the beginning of the read cycle. If the second group of bit line sensing circuits are allowed to begin developing their respective bit line voltages a delay of $(1/16)t_1$ after the first group, then the second group of 64 bits of data outputs are stored in the data buffers $(1/16)t_1$ later, and so forth (e.g., until all desired bit line sensing circuits have been accessed). Therefore, a period of the read cycle would be $t_0+t_1+t_2+N*(1/16)*t_1$ using the disclosed computing memories and disclosed methods of operating the computing memories, wherein N is a desired number of additional bit line sensing circuits associated with each sense amplifier being accessed (e.g., 15). Compared to memories that access one bit line sensing circuit per sense amplifier per read cycle (e.g., traditional memories), if the same amount of data (e.g., N=16) needs to be read, using the same number of sense amplifiers, this would require 16 separate read cycles or a total time of $16*(t_0+t_1+t_2)$ to access a same amount of data. In order words, compared to traditional memories, the disclosed computing memories and disclosed methods of operating the computing memories would advantageously save $15*(t_0+t_2)+(225/16)*t_1$ amount of time accessing the same amount of data.

For example, for an array (e.g., a faster array), $t_0=t_2=1$ ns, $t_1=10$ ns, the disclosed memories and methods would advantageously save $15*(1+1)+14.0625*10=170$ ns for the exemplary 1 MB computing memory, compared to traditional memories and methods. That is, a traditional memory would require 192 ns to read 1024 bits, while the disclosed memory would require 21.4 ns; the traditional memory would achieve 0.67 GB/s bandwidth, while the disclosed computing memory would achieve a 5.99 GB/s bandwidth.

In some embodiments, to further increase bandwidth, after the first group of bit line voltages has been passed to the sense amplifier, each of the corresponding bit line sensing circuits selectively couple to a 2nd bit line, different from the first group of bit lines, adding depth to the pipeline. If all 4096 bit lines are read out, a traditional memory would take four times longer (e.g., 4×192 ns=768 ns), which corresponds to a same bandwidth of 0.67 GB/s. In contrast, the disclosed computing memory would take 51.4 ns, which corresponds to a data throughput of 9.97 GB/s. For a 128 MB MRAM chip (e.g., 128 of the exemplary 1 MB array are operating in parallel), using the disclosed computing memories and/or disclosed memory operation methods, it would be possible to reach TB/s bandwidth.

In some traditional read operations, an entire row of bitcells is refreshed during a read (otherwise the data would be lost), but this row activation operation overly complicates a general purpose CPU or GPU to issue simple read and write commands, inhibiting performance. For example, additional controllers are used to convert simple read/write commands from a CPU/GPU into a stream of commands, but the commands issued to the memory are not in the same order as the command issued to the controller. In some traditional read operations associated with on-chip memories, access of an entire row of bitcells is not needed because there is no bandwidth limiting channel. In some traditional operations, accessing an entire of row bitcells is costly.

The disclosed memory and methods advantageously allow an entire row of bitcells as well as a portion of the entire row of bitcells to be efficiently accessed, allowing the memory to be used in diverse applications. For example, some neural network computations require large static data to be read quickly, and the static data include known sequences. Meanwhile, for general purpose computing, a portion of a row of bitcells is accessed with little predictability. Therefore, storing and accessing data using the disclosed memory and the disclosed methods would be advantageous for applications where a memory for neural network computations and general purpose computing is required.

FIG. 2 illustrates an exemplary memory 200, in accordance with an embodiment. In some embodiments, the computing memory 200 comprises bit lines BL, bit line sensing circuits 204, reference generator 206, sense amplifiers 208, data buffers 210, and a tag register 216.

In some embodiments, elements of computing memory 200 correspond to elements of computing memory 100. For example, bit lines BL are part of the memory array 102, the reference generator 206 is the reference generator 106, sense amplifiers 208 are sense amplifiers 108, and the data buffers 210 are data buffers 110. In some embodiments, the tag register 216 is included in the data buffers 110.

As illustrated, the computing memory 200 comprises k sense amplifiers, each corresponding to j groups of i bit lines and groups of j bit line sensing circuits 204. In the exemplary 1 MB computing memory, which has 2048 word lines×4096 bit lines, the 4096 bit lines are grouped into 64 sense amplifiers (i.e., k=64). Each sense amplifier can be selectively electrically coupled to one of 64 bit lines using a first MUX and a second MUX, such that k is 64, i is four, and j is 16, meaning each bit line sensing circuit 204 may be selectively electrically coupled to one of four bit lines, and each sense amplifier 208 may be selectively electrically coupled to one of 16 bit line sensing circuits 204.

In some embodiments, a j×k number of data is accessed during a same read cycle. That is, one bit line for each bit line sensing circuit is sensed by each corresponding sense amplifier. In some embodiments, in the 1 MB computing memory example, j is 16 and the number of sense amplifiers is 64, so the exemplary computing memory can access up to 1024 bits of data during a same read cycle. In some embodiments, more than one bit line of column slice is sensed by the same sense amplifier. For example, in the 1 MB computing memory example, the exemplary computing memory can access up to multiples of 1024 bits of data during a same read cycle.

In some embodiments, a sense enable signal (e.g., SAEN) is electrically coupled to each sense amplifier 208 to turn on or off the sense amplifier. For example, the sense amplifier enable signal turns on the sense amplifiers, allowing current to flow through the amplifier to generate an amplified output. In some embodiments, each of the BLEN2<j> signals turns on when a corresponding sense amplifier is ready for sensing and off when a data output associated with a current sensing operation is generated, allowing a selected bit line sensing circuit to be electrically coupled to the sense amplifier prior to sensing (e.g., a bit line voltage from the bit line sensing circuit is provided to the sense amplifier).

In some embodiments, a delay (e.g., tCLK 314 in FIG. 3) between a selective electrical coupling of a first bit line sensing circuit to the sense amplifier and a selective electrical coupling of a second bit line sensing circuit is delay less than a pulse width corresponding to the selective electrical coupling of the first bit line sensing circuit (e.g., the second bit line is accessed prior to an end of the access of the first bit line, a time needed to generate a data output; a time needed for the sense amplifier to turn on for amplifying the input and a time needed for the sense amplifier to turn off before being ready for a next input; a period of the sense enable signal (e.g., SAEN)) associated with the sense amplifier).

In some embodiments, the sense enable signal (e.g., SAEN) is high until bit line voltages of all the associated bit line sensing circuits are sensed (e.g., at tCLK apart, at less than tCLK apart); that is, the sense amplifier is continuously on as it senses bit line voltages of each of the associated bit line sensing circuits. Sensing of the bit lines may be advantageously sped up, and switching power associated with the SAEN signal is advantageously reduced.

As an exemplary advantage, by selectively electrically coupling more than one bit line sensing circuits to a same sense amplifier, more than one bit line corresponding to a sense amplifier can be accessed during a same cycle and read operation may be sped up, compared to memories that access one bit line for each sense amplifier during a same cycle. For example, the disclosed computing memory may allow more than one bit line voltage to be sensed by a same sense amplifier, increasing the computing memory's bandwidth and performance.

In some embodiments, the reference generator 206 is controlled by a reference enable signal (e.g., REFEN). In some embodiments, the reference enable signal allows the reference generator 206 to generate a reference signal (e.g., a reference voltage), and the reference signal is driven to inputs of the sense amplifiers 208 for amplification with a difference of a bit line voltage (e.g., from a bit line sensing circuit). In some embodiments, after generation of the reference signal, the reference enable signal deactivates the reference generator 206 and causes the reference generator 206 to hold the generated reference signal, as described herein.

In some embodiments, the data buffers 210 are coupled to a tag register 216 or comprise the tag register 216; the tag register sets a tag bit associated with a data output (e.g., data out 218 from a corresponding sense amplifier 208) to indicate whether the data output is ready to be accessed (e.g., by a host, by a processor, by a system, by a memory controller).

For example, a data output (e.g., from a sense amplifier) is stored (e.g., latched) in the data buffer, and in response to storing the data output, the tag register 216 designates the data output as being ready. In some embodiments, a requested data output (e.g., from receiving a corresponding memory address) is provided by the data buffer in accordance with a determination that the data output is designated as being ready by the tag register 216. In some embodiments, the tag register 216 designates the data output as ready by setting a tag bit associated with the data output to a ready value.

In some embodiments, a data output is designated as not ready prior to it being designated as ready (e.g., all tags associated with the data are set to not ready at the beginning of a read cycle). For example, the data output has not been stored or latched in the data buffer 110. As other examples, the data output has not been generated yet—the bit line associated with the data output has not been accessed, or the bit line voltage associated with the data output has not been developed.

In some embodiments, the computing memory receives a memory address for requested data different from an address of a stored data output (e.g., the requested data is not stored in the data buffer). In some embodiments, the computing memory is in a "Preemptive Column Mode." In accordance with the determination that the memory address is different from an address of a stored data output, the computing memory updates an order of bit line access (e.g., sensing of a bit line sensing circuit associated with the received memory address is prioritized; the prioritized bit line sensing circuit is selectively electrically coupled to the sense amplifier ahead of another bit line sensing circuit in accordance with the determination). By reordering bit line access, requested data may be provided faster, improving system performance by providing critical data earlier. In some embodiments, the order of bit line access is updated in accordance with a determination that the data associated with the memory address is designated as being not ready (e.g., by the tag register 216).

Figure 3:
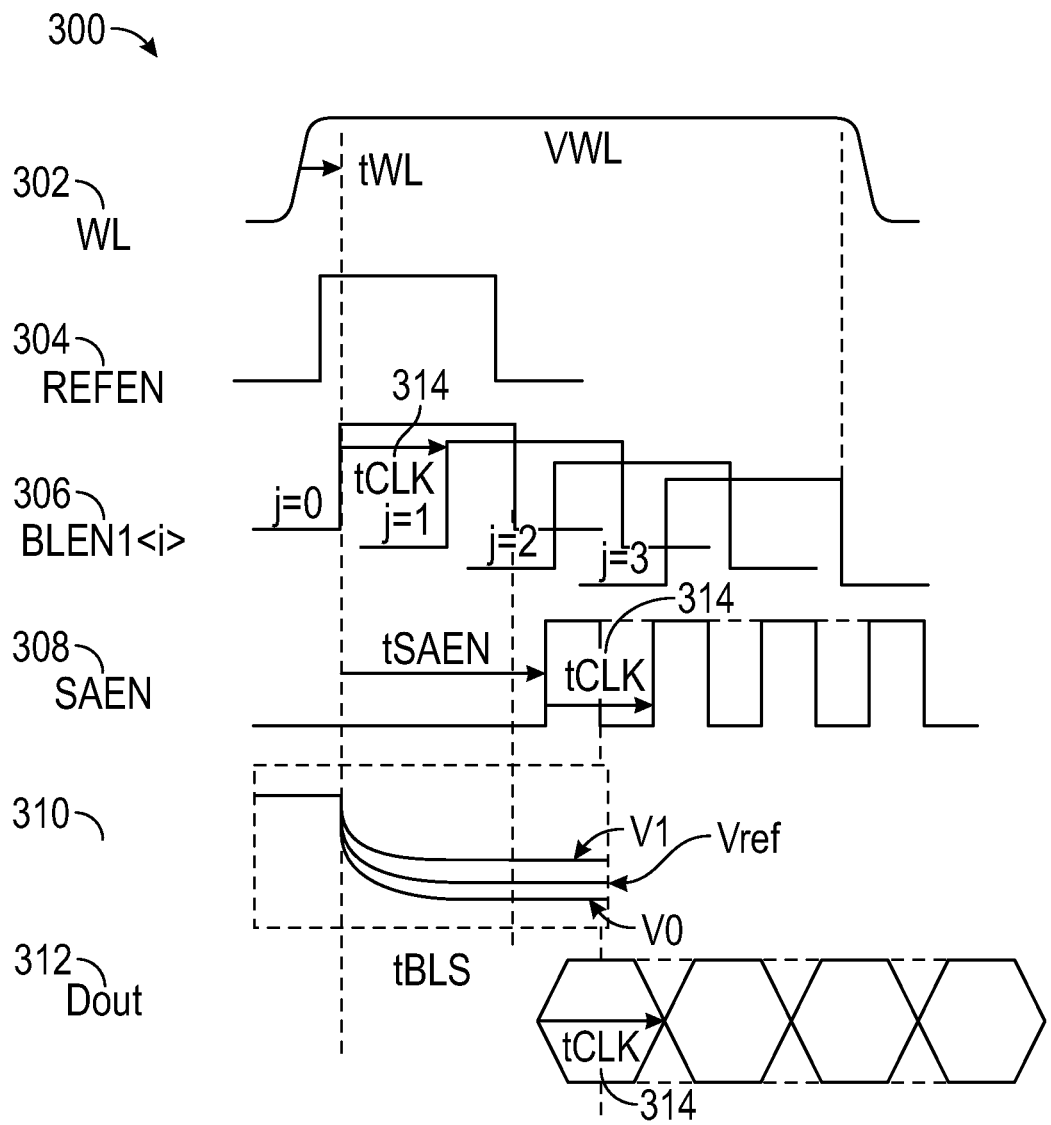
FIG. 3 illustrates exemplary timing diagrams of a memory, in accordance with an embodiment.

FIG. 3 illustrates exemplary timing diagrams 300 of a computing memory, in accordance with an embodiment. In some embodiments, the waveforms in the timing diagrams 300 correspond to signals associated with elements of computing memory 100 or computing memory 200. In some embodiments, the waveforms in the timing diagrams 300 are associated with elements corresponding to a sense amplifier (e.g., similar waveforms are observed corresponding to other sense amplifiers of the computing memory). In some embodiments, the waveforms in the timing diagrams 300 illustrate signals associated with one read cycle. In some embodiments, the timing diagrams 300 include word line signal 302, reference enable signal 304, bit line enable signals 306, sense amplifier enable signal 308, voltages 310, and data out signals 312.

In some embodiments, word line signal 302 is associated with access of a particular word line. For example, in the 1 MB exemplary computing memory, word line signal 302 is a word line driver output waveform associated with one of the 2048 word lines in the memory, depending on an address received and decoded by the computing memory. In some embodiments, the address is latched prior to decoding. While the particular word line is driven (e.g., the particular word line signal is a high pulse), access transistors of bitcells connected to the word line are turned on, allowing access from the word line side of the bitcells. In some embodiments, to improve performance (e.g., improve accuracy, reduce noise, improve speed), the word line is driven at a higher voltage (e.g., higher than the supply voltage, higher than a nominal word line voltage). In some embodiments, more than one bit line corresponding to a sense amplifier is accessed while a word line is accessed. As an exemplary advantage, word line decoder or driver power consumption is reduced (e.g., by an amount proportional to a number of the additionally accessed bit lines), compared to memories in which one bit line for each sense amplifier is accessed every time a word line is accessed.

In some embodiments, reference enable signal 304 controls a reference generator (e.g., reference generator 106, reference generator 206) of the computing memory. For example, a high signal for the reference enable signal causes the reference generator to generate a reference signal (e.g., a reference voltage), as described herein; a low signal for the reference enable signal causes the reference generator to deactivate reference generation. The generated reference signal is driven to inputs of the sense amplifiers (e.g., sense amplifiers 108, sense amplifiers 208) for amplification with a difference of a bit line voltage (e.g., from a bit line sensing circuit). In some embodiments, after generation of the reference signal, the reference signal is held using a sample and hold circuit. In some embodiments, after generation of the reference signal, the reference enable signal deactivates the reference generator (with a low signal) and causes the reference generator to hold the generated reference signal, as described herein. For example, a width of a pulse of the reference enable signal is a time needed for the reference voltage (e.g., $V_{ref}$ described with respect to voltages 310) to settle or develop to steady level (e.g., a smaller rate of change, compared to an initial rate of change)

In some embodiments, bit line enable signals 306 are associated with selected bit lines in bit line sensing circuits corresponding to a sense amplifier (e.g., BLEN1<i> signals in FIG. 2), allowing the selected bit lines to be coupled to a bit line sensing circuit. In some embodiments, there are j number (e.g., a number of bit lines sensing circuits per sense amplifier) of bit lines that are selected to electrically couple to a corresponding bit line sensing circuit in a read cycle, and a j number of bit line voltages are advantageously sensed by a same sense amplifier in the read cycle.

For example, in the exemplary 1 MB computing memory, there are four bit lines for each bit line sensing circuit, and there are 16 bit line sensing circuits for each sense amplifier. The bit line enable signals 306 corresponds to the selected $i^{th}$ bit line in each of the 16 groups of four bit lines. For example, the $0^{th}$ pulse corresponds to $i^{th}$ bit line associated with the $j=0^{th}$ bit line sensing circuit, the $1^{st}$ pulse corresponds to the $i^{th}$ bit line associated with the $j=1^{st}$ bit line sensing circuit, the $2^{nd}$ pulse corresponds to the $i^{th}$ bit line associated with the $j=2^{nd}$ bit line sensing circuit, and the $3^{rd}$ pulse corresponds to the $i^{th}$ bit line associated with the $j=3^{rd}$ bit line sensing circuit. The $i^{th}$ signal is determined based on an address received and decoded by the computing memory. In some embodiments, the address is latched prior to decoding.

In some embodiments, the bit line enable signal 306 causes a bit line to be accessed after a delay of tWL after a word line signal 302 causes a word line to be accessed. In some embodiments, the delay tWL is a time needed for the word line signal to settle at the high value. In some embodiments, the delay tWL is a time needed for a portion of the address associated with bit line selection to be latched and/or decoded.

In some embodiments, as illustrated by the vertical dash line, in response to a bit line enable signal selectively coupling (e.g., a corresponding bit line enable signal 306 goes high) a bit line to a bit line sensing circuit, the bit line voltage (e.g., bit line voltage of voltages 310) begins to develop. In some embodiments, a width of a bit line enable signal 306 is a time required for a respective bit line voltage to settle or develop. For example, the time required is a time needed for the bit line voltage (e.g., $V_1$ or $V_0$ described with respect to voltages 310) to settle or develop to steady level (e.g., a smaller rate of change, compared to a rate of change when the bit line is initially accessed). In some embodiments, the width of the bit line enable signal 306 is 10-15 ns.

In some embodiments, as illustrated, while a word line is being accessed (e.g., while the word line signal 302 is high), each of the bit line enable signals 306 enables a respective $i^{th}$ bit line in a sequential manner. That is, each of the bit line enable signals 306 causes each of the $i^{th}$ bit line to electrically couple to a respective bit line sensing circuit, allowing the bit line voltage to develop and be ready for sensing at the sense amplifier. By controlling the bit line enable signals 306 as described while a row is being accessed, more than one bit line corresponding to a sense amplifier can be advantageously accessed during a same cycle As an exemplary advantage, by accessing more than one bit line corresponding to a sense amplifier during a same cycle and holding the bit line voltages before they could be sensed, read operation may be sped up, compared to memories that access one bit line for each sense amplifier during a same cycle. For example, by allowing access to more than one bit line corresponding to a sense amplifier during a same cycle, the disclosed computing memory may allow more than one bit line voltage to concurrently settle (e.g., a second bit line voltage is allowed to settle or develop while a first bit line voltage is still settling or developing), reducing an amount of time required to access the second data (which may be a timing or performance bottle neck) and beyond.

Although the bit line enable signals 306 are illustrated as being active in a staggered manner, it is understood that the bit line enable signals 306 may selectively electrically couple a corresponding bit line to a bit line sensing circuit at any time such that the bit line voltage is given enough time to settle or develop before the bit line sensing circuit is electrically coupled to the sense amplifier for sensing and amplification. For example, the bit line enable signals 306 may all be active at a same time near a beginning of the read cycle (e.g., after a desired word line is accessed).

In some embodiments, during a read cycle, an order of accessing the bit lines is updated (e.g., in a "Preemptive Column Mode"). For example, an order of accessing the bit lines is accessing the bit lines associated with the $j=0^{th}$, $1^{st}$, $2^{nd}$, $3^{rd}$ bit line sensing circuits. After the $j=0^{th}$ bit line is being sensed and before the $j=1^{st}$ bit line is being sensed, a request for the data on the $j=3^{rd}$ bit line is made (e.g., from an address received by the computing memory). In response to the request for the $j=3^{rd}$ bit line, an order of accessing the bit line is updated. That is, the updated order of accessing the bit lines is accessing the bit lines associated $j=0^{th}$, $3^{rd}$, $1^{st}$, and $2^{nd}$ bit line sensing circuits, and the order of toggling of the bit line enable signal 306 is updated accordingly to allow the $j=3^{rd}$ bit line voltage to develop and to be sensed earlier. By reordering bit line access, requested data may be provided faster, improving system performance by providing critical data earlier.

In some embodiments, sense amplifier enable signal 308 (e.g., SAEN in FIG. 2) is electrically coupled to a sense amplifier (e.g., sense amplifier 108, sense amplifier 208, sense amplifier 500) to turn on (e.g., a high signal) or off (e.g., a low signal) the sense amplifier. For example, the sense amplifier enable signal 308 turns on the sense amplifiers, allowing current to flow through the amplifier to generate an amplified output (e.g., data out 218, data out 508). In some embodiments, each of the BLEN2<j> (e.g., in FIG. 2; not shown in FIG. 3) signals turns on and off when a corresponding sense amplifier is ready for sensing and off when a data output associated with a current sensing operation is generated, allowing a selected bit line sensing circuit to be electrically coupled to the sense amplifier prior to sensing. For example, the first sense amplifier enable pulse is associated with sensing of the bit line voltage from the $j=0^{th}$ bit line sensing circuit, the second sense amplifier enable pulse is associated with sensing of the bit line voltage from the $j=1^{st}$ bit line sensing circuit, and so on.

In some embodiments, a delay (e.g., tCLK 314) between a selective electrical coupling of a first bit line sensing circuit (e.g., the $j=0^{th}$ bit line sensing circuit) to the sense amplifier and a selective electrical coupling of a second bit line sensing circuit (e.g., the $j=1^{st}$ bit line sensing circuit) is less than a pulse width corresponding to the selective electrical coupling of the first bit line sensing circuit (e.g., the second bit line is accessed prior to an end of the access of the first bit line, a time needed to sense and generate a data output; a time needed for the sense amplifier to turn on for amplifying the input and a time needed for the sense amplifier to turn off before being ready for a next input, a period (e.g., tCLK 314) of the sense enable signal 308 (e.g., SAEN)) associated with the sense amplifier.

In some embodiments, the sense enable signal (e.g., SAEN) is high until bit line voltages of all the associated bit line sensing circuits are sensed (as illustrated with dashed lines) (e.g., at tCLK apart, at less than tCLK apart); that is, the sense amplifier is continuously on as it senses bit line voltages of each of the associated bit line sensing circuits. Sensing of the bit lines may be advantageously sped up, and switching power associated with the SAEN signal is advantageously reduced.

In some embodiments, tCLK is 0.6 ns, which is shorter than a time needed for a bit line voltage to settle or develop (e.g., shorter than a bit line enable signal pulse width, shorter than 10-20 ns). As an exemplary advantage, by selectively electrically coupling more than one bit line sensing circuits to a same sense amplifier at delays of tCLK, more than one bit line of a column slice can be accessed during a same cycle and read operation may be sped up, compared to memories that access one bit line for each sense amplifier during a same cycle. For example, for each bit line sensing circuit after the $j=0^{th}$ bit line sensing circuit, a time saving of at least [pulse width of bit line enable signal]−[tCLK] is reduced. For the sake of brevity, specific timing saving values described with respect to FIG. 1 (also applicable to advantages associated with the timing waveforms of FIG. 2) and not described again here.

In some embodiments, voltages 310 illustrates exemplary waveforms of a voltage of a bit line associated with a state of an accessed bitcell and of an exemplary reference voltage. In some embodiments, the voltage of the bit line associated with a state of an accessed bitcell corresponds to an output of a bit line sensing circuit voltage or the node $V_{data}$ in FIG. 4, the node 428, or the node VBL<i> in FIG. 5. In some embodiments, the exemplary reference voltage is an output voltage of a reference generator (e.g., reference generator 106, reference generator 206).

For example, if the data stored in the bitcell is a "1" or high, a voltage above a reference voltage (e.g., $V_1$) would be generated after the bit line voltage settles or develops, and if the data stored in the bitcell is a "0" or low, a voltage below a reference voltage (e.g., $V_0$) would be generated after the bit line voltage settles or develops. After the corresponding word line and corresponding bit line are accessed, the bitcell is electrically coupled to the bit line sensing circuit 104 through the corresponding bit line, the bit line voltage begins to settle or develop, and the settling or developed voltage depends on an effective signal value (e.g., resistance) of the memory bitcell (e.g., MRAM bitcell), which corresponds to the state of the bitcell data.

For instance, if the state of the bitcell is "1" or high, the effective resistance is higher and hence, the settled or developed voltage would be higher (e.g., a developed voltage is higher), and if the state of the bitcell is "0" or low, the effective resistance is lower and hence, the settled or developed voltage would be lower (e.g., a developed voltage is low) because a same current traverses the bitcell from the bit line sensing circuit.

It is understood that, in some embodiments, the bitcell data and the data's corresponding signal sensed, captured, or generated in the bit line sensing circuit may have a different relationship (e.g., a "1" corresponds to a lower signal value, a "0" corresponds to a higher signal value) without departing from the scope of the disclosure.

In some embodiments, the voltage $V_{ref}$ illustrates a waveform of an output of the reference generator (e.g., reference voltage from reference generator 106, reference voltage from reference generator 206). In some embodiments, in response to a high reference signal enable pulse (e.g., reference enable signal 304), the reference voltage $V_{ref}$ begins to generate. For example, the reference voltage $V_{ref}$ decays or grows until it settles or develops (e.g., the voltage is experiencing a smaller rate of change, compared a rate of change when the reference enable signal is initially high) into a reference voltage.

In some embodiments, as illustrated, once the reference voltage is generated, the reference enable signal 304 may deactivate sensing (e.g., the reference enable signal 304 goes low). In some embodiments, once the reference voltage is generated and the $0^{th}$ bit line voltage settles or develops (as indicated by the second vertical dashed line), the sense enable pulse (e.g., rising edge of the sense enable pulse, first pulse of the sense enable signal 308) turns on the sense amplifier to perform its first amplification of the read cycle. In some embodiments, the reference voltage $V_{ref}$ is held (e.g., using a sampling capacitor) until the last bit line voltage is amplified by a sense amplifier (e.g., until all the sense amplifiers electrically coupled to the reference voltage in the computing memory completed sensing in a read cycle).

In some embodiments, data out signal 312 illustrates an output waveform of a sense amplifier; depending on the state of the accessed bitcell, which would affect the value of the settled or developed bit line voltage, the sense amplifier outputs a data out signal that correspond to the state of the accessed bitcell. For example, if the accessed bitcell stores a "1," the data out signal would be a high signal, and if the accessed bitcell stores a "0," the data out signal would be a low signal. In some embodiments, a delay between successive data outs is tCLK 314, which is described herein.

In some embodiments, the data out signal 312 is passed to a data buffer (e.g., data buffer 110, data buffer 210) for storage before providing the data out signal in response to a request to the computing memory.

It is understood that the waveforms associated with data out signal 312 are exemplary to illustrate high-to-low transition and low-to-high transitions, and the data out signal 312 may not comprise two different signal levels, as illustrated. In some embodiments, consecutive high outputs would not result in a transition of the signal (e.g., the signal remains high without toggling), and consecutive low outputs would not result in a transition of the signal (e.g., the signal remains low without toggling).

In some embodiments, less than a j number of bit lines are accessed for a sense amplifier during a read cycle. For example, the computing memory is in a random-access mode, and one bit line for a sense amplifier is accessed, depending on the address associated with the random-access mode. As another example, in response to receiving an instruction to access less than a j number of bit lines corresponding to a sense amplifier, a bit line sensing circuit associated with the non-accessed bit lines is not selected for bit line voltage development and/or sensing at the sense amplifier.

It is understood that the waveforms described with respect to timing diagrams 300 are exemplary and that other waveforms controlling the elements of the computing memory or representing signals of these elements exist without departing from the scope of the disclosure. For example, the sense enable signal (e.g., SAEN) is high until bit line voltages of all the associated bit line sensing circuits are sensed. As another example, instead of a "high" pulse, a "low" pulse may enable an element (e.g., reference generation, sense amplifier enable, bit line enable, word line enable). As another example, an inverting buffer may be connected to an output of a sense amplifier, inverting the signal levels of the data out signal.

Figure 4:
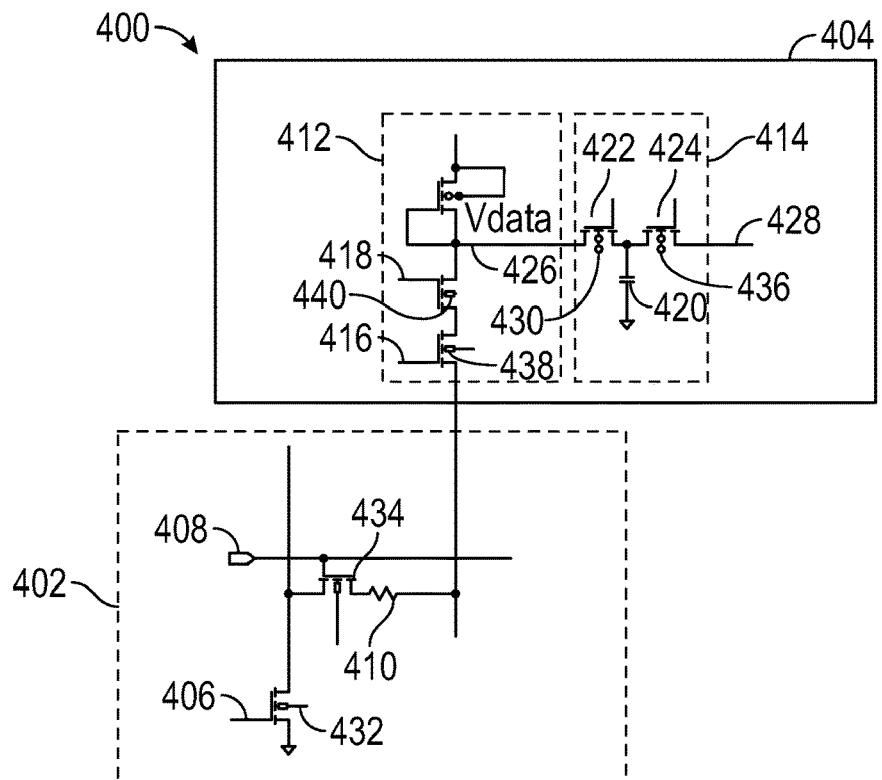
FIG. 4 illustrates an exemplary sensing circuit of a memory, in accordance with an embodiment.

FIG. 4 illustrates an exemplary sensing circuit 400 of a computing memory, in accordance with an embodiment. In some embodiments, the sensing circuit 400 comprises a bit line sensing circuit 404. In some embodiments, the bit line sensing circuit 404 is the bit line sensing circuit 104 or bit line sensing circuit 204.

In some embodiments, the bit line sensing circuit 404 is electrically coupled to a bitcell 402. In some embodiments, the bitcell 402 is a part of memory array 102. In some embodiments, the bitcell 402 is at one of the group of bit lines associated with the bit line sensing circuit 404. For example, in the 1 MB exemplary computing memory, the bitcell 402 is at one of the four bit lines associated with one of the bit line sensing circuits.

In some embodiments, the bitcell comprises a bit line access transistor 432 and a word line access transistor 434 (e.g., word line access transistor adjacent to a magnetic tunnel junction (MTJ) of a bitcell inside a memory array). In some embodiments, the bit line access transistor is controlled with a bit line enable signal (e.g., bit line enable signal 306, BLEN1<i>) and the word line access transistor is controlled with a word line signal (e.g., word line signal 302). Based on a decoded memory address, a combination of bit line enable signal and word line signal allows corresponding bitcells to be accessed by the bit line sensing circuit 404. In some embodiments, the address is latched prior to decoding. For example, a path for current is allowed to flow from the bit line sensing circuit 404, to the word line access transistor 434 of an accessed bitcell, to the bit line access transistor 432 of the accessed bitcell, and to ground.

In some embodiments, the bitcell 402 has an effective resistance (e.g., representing the MTJ of the bitcell), modeled by resistor 410 (e.g., the bitcell 402 is a MRAM bitcell). By allowing a current to flow from the bit line sensing circuit 404 to ground through the bitcell 402, a voltage $V_{data}$ is generated based on the effective resistance 410. For example, if the state of the bitcell is "1" or high, the effective resistance is higher and hence, the settled or developed voltage would be higher (e.g., a generated voltage is higher; $V_1$ of voltages 310 in FIG. 3), and if the state of the bitcell is "0" or low, the effective resistance is lower and hence, the settled or developed voltage would be lower (e.g., a generated voltage is lower; $V_0$ of voltages 310 in FIG. 3).

It is understood that, in some embodiments, the bitcell data and the data's corresponding signal sensed, captured, or generated in the bit line sensing circuit may have a different relationship (e.g., a "1" corresponds to a lower signal value, a "0" corresponds to a higher signal value) without departing from the scope of the disclosure.

In some embodiments, the bit line sensing circuit 404 comprises a bit line current path circuit 412 (e.g., a current source) that provides the current from the bit line sensing circuit 404, to the bitcell 402, and to ground to generate the bit line voltage $V_{data}$. As illustrated, the bit line current path circuit 412 comprises a transistor 438 controlled by signal 416 and a transistor 440 controlled by signal 418. In some embodiments, the signal 416 is a bit line enable signal (e.g., bit line enable signal 306, BLEN1<i> in FIG. 2), which selectively electrically couple a bit line to the bit line sensing circuit 404 based on a decoded address.

In some embodiments, the signal 418 is a voltage clamp signal. In some embodiments, the bitcell 402 may be affected if the current through the bitcell is too high (e.g., current through a MTJ of a MRAM bitcell, current through a PCM bitcell, current through a RRAM bitcell), causing the bitcell to change its state (e.g., the bitcell is erroneously written). The voltage clamp signal limits a current through the bitcell 402 by adjusting a level of operation of transistor 418 and adjusting a current from the current source providing the current to the bitcell. In some embodiments, as illustrated, the transistor 440 is configured as a source follower, such that the $V_{GS}$ of the transistor 440 is approximately $V_{clamp} - V_{th}$ (e.g., threshold voltage of transistor 440). That is, the current provided to the bitcell may be adjusted to be a function of to $V_{clamp} - V_{th}$.

In some embodiments, the bit line sensing circuit 404 comprises a sample and hold circuit 414. In some embodiments, the sample and hold circuit comprises a sampling capacitor 420, a transistor 430 controlled by signal 422, and a transistor 436 controlled by signal 424. When the bit line voltage is developed, the transistor 430 couples (e.g., signal 422 turns on the transistor 430) the voltage $V_{data}$ 426 to the sampling capacitor 420. In some embodiments, the signal 422 is a bit line enable signal or a signal that switches concurrently with the bit line enable signal, allowing the sampling of $V_{data}$ 426 as it develops and capturing the bit line voltage associated with the accessed bitcell. At this time, signal 424 keeps transistor 436 off while the voltage $V_{data}$ 426 is being sampled.

After the developed bit line voltage is sampled, the signals 406, 416, and 422 disconnect the bit line sensing circuit 404 from the accessed bitcell and voltage (associated with the state of the accessed bitcell) is stored in the sampling capacitor 420. When the sampled bit line voltage is ready to be sensed (e.g., when it is bit line sensing circuit 404's turn to be sensed, as described with respect to FIG. 3), signal 424 turns on transistor 436 and allow the sampled bit line voltage 428 to be outputted to an input of a sense amplifier (e.g., sense amplifier 108, sense amplifier 208, sense amplifier 500). In some embodiments, the signal 424 is BLEN2<j>, which is described herein. In some embodiments, the signal 424 is a complementary signal of BLEN1<i>.

As an exemplary advantage, by sampling the bit line voltages before they could be sensed, read operation may be sped up, compared to memories that access one bit line for each sense amplifier during a same cycle. For example, the disclosed computing memory may allow more than one bit line voltage from different bit line sensing circuits to be sensed by a same sense amplifier (e.g., while a bit line voltage of a first bit line sensing circuit is being sensed, a bit line voltage of a second bit line sensing circuit is held until it is ready to be sensed), reducing an amount of time required to access the second data (which may be a timing or performance bottle neck) and beyond.

Due to parasitic capacitances of the transistor 430 associated with signal 422 (e.g., bit line enable signal), an undesired charge may be injected into the sampling capacitor 420 (e.g., with signal 422 goes from high to low), affecting the sampled value of the bit line voltage and the accuracy of the bit line voltage 428. The injected charge may affect an input to the sense amplifier and cause inaccurate sensing (e.g., a state of the accessed bit cell may not be accurately read).

In some embodiments, the sample and hold circuit 414 comprises a charge injection reduction circuit (not shown). In some embodiments, this charge injection reduction circuit is also used in the reference generator to reduce charge injection and increase the accuracy of the reference voltage being held.

In some embodiments, a dummy switch, clocked by a signal opposite to the signal 422, is connected to the node between the transistor 430 and the sampling capacitor 420 to absorb at least a portion of the injected charge, reducing noise on the value sampled on the sampling capacitor 420 and increasing an accuracy of the bit line voltage 428. In some embodiments, the value of the sampling capacitor 420 and a size of the dummy switch is sized appropriately to absorb a desired amount of injected charge. For example, the value of the sampling capacitor 420 is set to be equal the effective capacitance seen at the node of $V_{data}$ 426 to direct half of the injected charge to both sides of the transistor 430, and the size of the dummy switch is half of the size of the transistor 430 to absorb the directed injected charge.

In some embodiments, the charge injection reduction circuit includes a switch (e.g., a transistor; not shown) added between the sampling capacitor 420 and ground. Prior to the signal 422 turning off the connected transistor to conclude sampling, this switch turns off and disconnects the sampling capacitor 420 from ground, disconnecting a path for the injected charge to enter the sampling capacitor and affecting the accuracy of the sampled bit line voltage. In some embodiments, turning off this switch introduces an offset voltage to the sampled bit line voltage; this offset can be cancelled prior to sensing of the bit line voltage.

Although the bitcell 402 and the bit line sensing circuit 404 are expressively described with the illustrated components and control signals, it is understood that the example in FIG. 4 is not limiting. The bitcell 402 and the bit line sensing circuit 404 may include less or additional elements and may be controlled with other signals without departing from the scope of the disclosure. For example, the bit line current circuit path circuit 412 may not comprise transistor 438 or transistor 440. As another example, a current path at the bitcell 402 may be different due to a different bitcell structure. As yet another example, a current path generating the sample may be different than illustrated; for instance, a current may flow from the bitcell 402 to the bit line current path circuit 412 to generate the bit line voltage.

Figure 5:
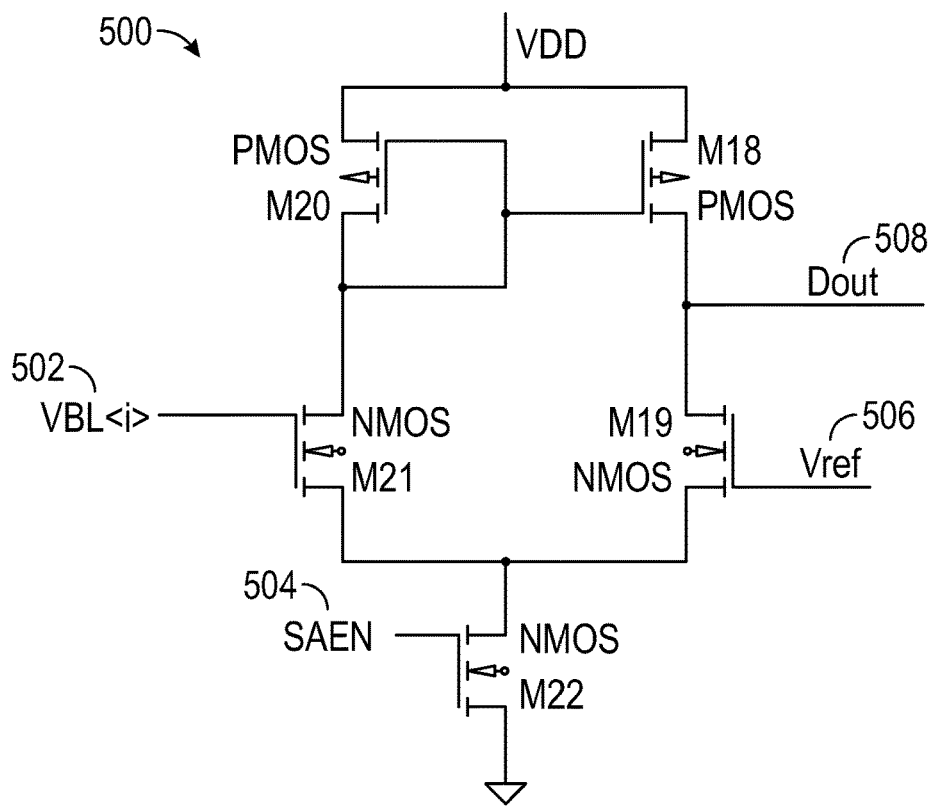
FIG. 5 illustrates an exemplary sense amplifier of a memory, in accordance with an embodiment.

FIG. 5 illustrates an exemplary sense amplifier 500 of a computing memory, in accordance with an embodiment. In some embodiments, the sense amplifier 500 is sense amplifier 108 or sense amplifier 208. In some embodiments, the sense amplifier 500 is a differential amplifier comprising two inputs and a control terminal. In some embodiments, the inputs are electrically coupled to bit line voltage 502 (e.g., bit line voltage 428) and reference voltage 506 (e.g., from reference generator 106, from reference generator 206), and the control terminal is coupled to the sense amplifier enable signal 504 (e.g., sense amplifier enable signal 308).

In some embodiments, the sense amplifier enable signal 504 turns on the sense amplifier, allowing currents to flow through the two branches of the amplifier to generate an amplified output. In some embodiments, the sense amplifier enable signal 504 keeps the sense amplifier on for multiple inputs (e.g., the sense amplifier is kept on while bit line voltages of all the bit line sensing circuits are each sensed). In some embodiments, the sense amplifier 500 amplifies a difference between the two inputs bit line voltage 502 and reference voltage 506 and outputs the amplified difference to data out 508 (e.g., data out 218, data out 312). For example, if the bit line voltage 502 is greater than the reference voltage 506 (e.g., the corresponding bitcell comprises a "1" data, $V_1$ described with respect to voltages 310 in FIG. 3), the data output 508 would be a higher voltage (e.g., greater than $V_{DD}/2$, $V_{DD}$), and if the bit line voltage 502 is less than the reference voltage 506 (e.g., the corresponding bitcell comprises a "0" data, $V_0$ described with respect to voltages 310 in FIG. 3), the data output 508 would be a lower voltage (e.g., less than $V_{DD}/2$, ground).

It is understood that the sense amplifier 500 illustrated in FIG. 5 is merely exemplary. It is understood that other configurations of the sense amplifier exist without departing from the scope of the disclosure. For example, the sense amplifier 500 is electrically coupled to a buffer to better drive a subsequent stage, and the subsequent stage would be updated according to a polarity of the buffered signal. As another example, the sense amplifier is a latch-base amplifier.

Figure 6:
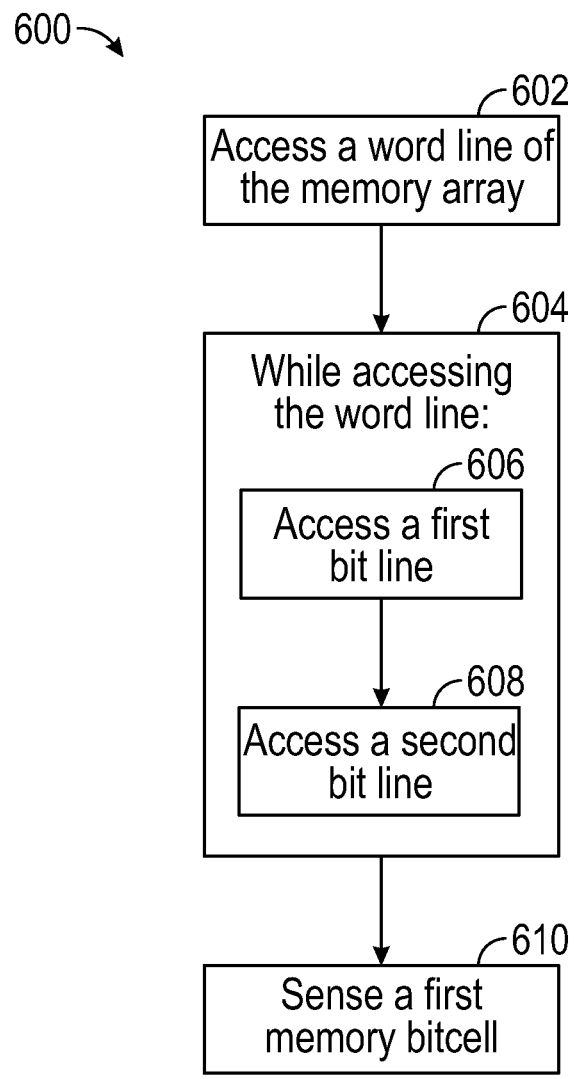
FIG. 6 illustrates an exemplary method of operating a memory, in accordance with an embodiment.

FIG. 6 illustrates an exemplary method 600 of operating a memory, in accordance with an embodiment. Although the method 600 is illustrated as including the described steps, it is understood that different order of steps, additional steps, or less steps may be performed to operate the exemplary computing memory without departing from the scope of the disclosure. It is also understood that the method 600 may be performed with other methods disclosed herein. In some embodiments, the method 600 is used to operate the computing memory 100, 200, 812, 1300.

In some embodiments, the method 600 comprises accessing a word line of a memory array (step 602). For example, a word line signal 302 access a row of the memory array, based on a decoded memory address, as illustrated with respect to FIG. 3. The word line signal 302 turns on transistors (e.g., word line access transistor 434 in bitcell 402) in bitcells controlled by the word line signal.

In some embodiments, the method 600 comprises while accessing the word line of the memory array (step 604), accessing a first bit line corresponding to a sense amplifier (step 606). For example, while the word line signal 302 is high, as illustrated with respect to FIG. 3, a first bit line (e.g., the $i^{th}$ bit line associated with the $0^{th}$ bit line sensing circuit corresponding to a sense amplifier) is accessed.

In some embodiments, the method 600 comprises while accessing the word line of the memory array, sampling and holding a settled or developed voltage associated with a state of the first memory bitcell. For example, a sample and hold circuit (e.g., sample and hold circuit 414) samples and hold $V_{data}$ from an accessed bit line. In some embodiments, the method 600 comprises reducing injected charge into the sample and hold circuit. For example, a charge injection reduction circuit, as described herein, is electrically coupled to the sample and hold circuit to reduce charge injection and increase accuracy of the sampled bit line voltage.

In some embodiments, the method 600 comprises while accessing the word line of the memory array (step 604), accessing a second bit line corresponding to the sense amplifier (step 608). For example, while the word line signal 302 is high, as illustrated with respect to FIG. 3, a second bit line (e.g., the $i^{th}$ bit line associated with the $1^{st}$ bit line sensing circuit corresponding to the sense amplifier) is accessed. As another example, the second bit line corresponding to the sense amplifier is accessed in response to the updating of the order of bit line access (e.g., in the "Preemptive Column Mode"), as described with respect to method 700.

In some embodiments, accessing the second bit line comprises accessing the second bit line while accessing the first bit line. For example, the time difference between the access of the first bit line and the access of the second bit line is tCLK or less than a pulse width corresponding to the selective electrical coupling of the first bit line sensing circuit (e.g., the second bit line is accessed prior to an end of the access of the first bit line, a time needed to generate a data output; a time needed for the sense amplifier to turn on for amplifying the input and a time needed for the sense amplifier to turn off before being ready for a next input; a period of the sense enable signal (e.g., SAEN)) associated with the sense amplifier).

In some embodiments, the first bit line belongs to a first set of bit lines in the memory array, and the second bit line belongs to a second set of bit lines in the memory array. For example, in the exemplary 1 MB computing memory, the first accessed bit line belongs to a first group of four bit lines in a column slice, and the second accessed bit line belongs to a second group of four bit lines in another column slice.

In some embodiments, the method 600 comprises sensing, with the sense amplifier, a first memory bitcell (step 610). For example, a bit line voltage associated with an accessed bitcell (e.g., bitcell 402) is being sensed and amplified by a sense amplifier (e.g., sense amplifier 108, sense amplifier 208, sense amplifier 500), and the sense amplifier outputs a signal (e.g., data out 218, data out 508) corresponding to the state of the bitcell.

In some embodiments, the method 600 comprises sensing a second memory bitcell of the memory array at the word line and the second bit line. For example, a bit line voltage (e.g., from a second bit line sensing circuit) associated with a second accessed bitcell (e.g., bitcell 402) is being sensed and amplified by the sense amplifier (e.g., sense amplifier 108, sense amplifier 208, sense amplifier 500), and the sense amplifier outputs a signal (e.g., data out 218, data out 508) corresponding to the state of the second bitcell. In some embodiments, the second bit line is associated with a next bit line in an order of bit line access. In some embodiments, the second bit line is associated with a next bit line in an updated order of bit line access (e.g., as described with respect to method 700).

In some embodiments, the first memory bitcell and the second memory bitcell are sensed with the sense amplifier. For example, a first and a second bit line sensing circuit (e.g., bit line sensing circuit 104, bit line sensing circuit 204, bit line sensing circuit 404) provides a respective bit line voltage (e.g., when a respective BLEN2<j> signal selectively electrically couple a bit line sensing circuit to the sense amplifier) to the sense amplifier at different times during a same read cycle.

In some embodiments, the method 600 comprises generating a reference voltage, and sensing a second memory bitcell of the memory array at the word line and the second bit line. In some embodiments, sensing the first memory bitcell of the memory array comprises amplifying a difference between a settled or developed voltage associated with a state of the first memory bitcell and the reference voltage, and sensing the second memory bitcell of the memory array comprises amplifying a difference between a settled or developed voltage associated with a state of the second memory bitcell and the reference voltage.

For example, a reference voltage is generated using a reference generator (e.g., reference generator 106, reference generator 206). A sense amplifier (e.g., sense amplifier 108, sense amplifier 208, sense amplifier 500) amplifies a difference between a bit line voltage (e.g., bit line voltage 428) of a bit line sensing circuit (e.g., bit line sensing circuit 104, bit line sensing circuit 204, bit line sensing circuit 404) and the reference voltage; the output voltages of the bit line sensing circuits are associated with the $j=0^{th}$ bit line sensing circuit and $1^{st}$ bit line sensing circuit or a bit line sensing circuit associated with an updated bit line access order.

In some embodiments, the method 600 comprises in response to generation of the reference voltage: stopping the generation of the reference voltage, and holding the reference voltage until sensing of the second memory bitcell is completed. For example, a reference enable signal (e.g., REFEN in FIG. 2, reference enable signal 304) causes generation of a reference voltage to stop (e.g., in response to a reference voltage being sufficiently generated). The reference voltage is held after the reference voltage is generated. In some embodiments, the reference voltage is held (e.g., sampled) using a capacitor.

In some embodiments, the method 600 comprises generating, based on the sensed first memory bitcell, a first data output associated with a state of the first memory bitcell, and storing the first data output in a data buffer. For example, a data output is generated by a sense amplifier (e.g., sense amplifier 108, sense amplifier 208, sense amplifier 500), and the data output is stored in a data buffer (e.g., data buffer 110, data buffer 210).

In some embodiments, the method 600 comprises sensing a second memory bitcell of the memory array at the word line and the second bit line, generating, based on the sensed second memory bitcell, a second data output associated with a state of the second memory bitcell, and storing the second data output in the data buffer. In some embodiments, a time difference between the generation of the first data output and the generation of the second data output is a delay between the sensing of the first memory bitcell and the sensing of the second memory bitcell.

For example, a second bit line sensing circuit (e.g., bit line sensing circuit 104, bit line sensing circuit 204, bit line sensing circuit 404) outputs a bit line voltage to a sense amplifier (e.g., sense amplifier 108, sense amplifier 208, sense amplifier 500), and the sense amplifier generates a data output based on the input. The generated data output is stored in a data buffer (e.g., data buffer 110, data buffer 210). A time difference between the output of the first data output (e.g., associated with the first accessed bit line) and the output of the second data output (e.g., associated with the second accessed bit line) is tCLK.

In some embodiments, the method 600 comprises receiving a memory address, determining whether the memory address is the first address, and in accordance with a determination that the memory address is the first address, outputting the first data output from the data buffer. In some embodiments, the method 600 comprises in accordance with a determination that the memory address is not the first address, forgoing outputting the first data output from the data buffer. In some embodiments, the word line and the first bit line are at a first address of the memory array. For example, the computing memory (e.g., computing memory 100, computing memory 200) receive a memory address, and the memory address is the address of the first bitcell (e.g., bitcell 402). Based on the received address, the data buffer outputs the data associated with the first bitcell (e.g., stored data output from the sense amplifier associated with a state of the first bitcell).

In some embodiments, the method 600 comprises in response to latching the first data output, designating the first data output as ready, wherein outputting the first data output from the data buffer is further in accordance with a determination that the first data output is designated as ready. In some embodiments, storing the first output in the data buffer comprises latching the first data output in the data buffer.

For example, a data output (e.g., from a sense amplifier) is stored and latched in a data buffer (e.g., data buffer 110, data buffer 210). In response to the data output being latched in the data buffer, the data output is designated as ready. When a request for data is received, the data is provided in accordance with a determination that the data output is designated as ready.

In some embodiments, designating the first data output as ready comprises setting a tag bit associated with the first data output to a ready value. For example, a data output is designated as being ready using a tag register (e.g., tag resister 216), which sets a tag bit of the data output to designate it as ready.

In some embodiments, the first data output is prefetched, and the memory address is not received from a host accessing the computing memory. For example, a data output is provided without an input from a host accessing the computing memory (e.g., prior to the host requesting for the data output). The data output may be predetermined based on previous access pattern and memory controller training, allowing memory to be accessed more quickly and improving system performance. In some embodiments, the size of the prefetched data is programmable (e.g., by a host, with an input, based on training data).

In some embodiments, a state of the first memory bit cell is associated with a first output word, and a state of the second memory bit cell is associated with a second output word. For example, the first accessed bit line is associated with a first output word, and the second accessed bit line is associated with a second output word. That is, by accessing more than bit line of a column slice during a ready cycle, the computing memory (e.g., computing memory 100, computing memory 200) outputs more than one output word during a same read cycle.

Figure 7:
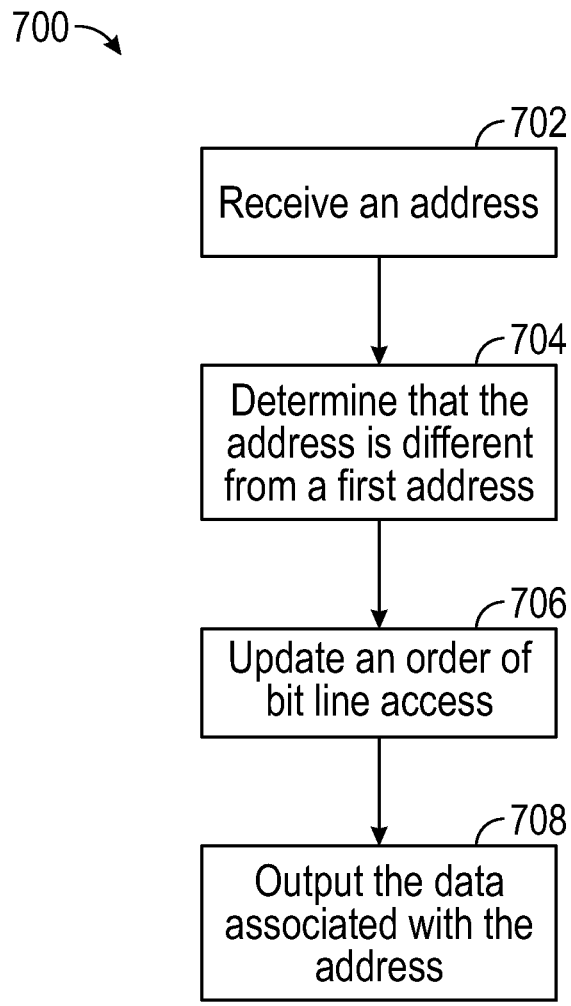
FIG. 7 illustrates an exemplary method of operating a memory, in accordance with an embodiment.

FIG. 7 illustrates an exemplary method 700 of operating a memory, in accordance with an embodiment. Although the method 700 is illustrated as including the described steps, it is understood that different order of steps, additional steps, or less steps may be performed to operate the exemplary computing memory without departing from the scope of the disclosure. It is also understood that the method 700 may be performed with other methods disclosed herein. In some embodiments, the method 700 is used to operate the computing memory 100, 200, 812, 1300. Steps of the method 700 may be referred as the "Preemptive Column Mode."

In some embodiments, the method 700 comprises receiving an address (step 702). For example, a computing memory (e.g., computing memory 100, computing memory 200) receives an address associated with requested data. The received address is associated with a bitcell (e.g., bitcell 402) location in a memory array (e.g., memory array 102).

In some embodiments, the method 700 comprises determining that the address is different from a first address (step 704). For example, the computing memory (e.g., computing memory 100, computing memory 200) determines that the received address is different from an address associated with an accessed bit line (e.g., a $0^{th}$ bit line sensing circuit that is already accessing a selectively coupled bit line, but the received address is not associated with the $0^{th}$ bit line sensing circuit).

In some embodiments, the method 700 comprises updating an order of bit line access (step 706). For example, in accordance with a determination that the received address is different from an address associated with an accessed bit line (e.g., a $0^{th}$ bit line sensing circuit that is already accessing a selectively coupled bit line, but the received address is not associated with the $0^{th}$ bit line sensing circuit), an order of bit line access is updated. In some embodiments, in accordance with a determination that the received address is not different from the address associated with the accessed bit line, updating of the order of bit line access is forgone. As an example, an order of accessing the bit lines is accessing the bit lines associated with the $j=0^{th}$, $1^{st}$, $2^{nd}$, $3^{rd}$ bit line sensing circuit. After the $j=0^{th}$ bit line is being sensed and before the $j=1^{st}$ bit line is being sensed, a request for the data on the $j=3^{rd}$ bit line is made (e.g., from an address received by the computing memory). In response to the request for the $j=3^{rd}$ bit line, an order of accessing the bit line is updated. That is, the updated order of accessing the bit lines is accessing the bit lines associated with the $j=0^{th}$, $3^{rd}$, $1^{st}$, and $2^{nd}$ bit line sensing circuits, and the order of toggling of the bit line enable signal 306 is updated accordingly to allow the $j=3^{rd}$ bit line voltage to develop and to be sensed earlier. By reordering bit line access, requested data may be provided faster, improving system performance by providing critical data earlier.

In some embodiments, the method 700 comprises outputting the data associated with the address (step 708). For example, after an order of bit line access is updated, the $j=3^{rd}$ bit line is accessed earlier, compared to an order of bit line access before the update. After the $j=3^{rd}$ bit line is accessed and sensed (e.g., by a sense amplifier), a corresponding output is generated and outputted (e.g., to a data buffer, as described herein; provided to a host or memory interface).

In some embodiments, the method 700 further comprises determining whether the data output is latched in a data buffer, and in accordance with a determination that the data output is not latched in a data buffer, designating a data output associated with the second address as not ready. In some embodiments, the method 700 comprises in accordance with a determination that the memory that the data output is latched in the data buffer, forgoing designating the data output associated with the second address as not ready. In some embodiments, the second bit line of the column slice of the memory array is accessed further in response to designating the data output associated with the second address as not ready. In some embodiments, designating the second data output as not ready comprises setting a tag bit associated with the second data output to a not ready value.

For example, the tag register 216 designates a data output as not ready prior to it designated as ready. For example, the data output has not been stored or latched in the data buffer 110. As another example, all tags associated with the data are set to not ready at the beginning of a read cycle. As other examples, the data output has not been generated yet—the bit line associated with the data output has not been accessed, or the bit line voltage associated with the data output has not been developed or sensed. A request for data at an address is received, and the computing memory determines that the requested data has not been accessed (e.g., by a bit line sensing circuit, by a sense amplifier) or not stored or latched in a data buffer (e.g., data buffer 110, data buffer 210).

Figure 8:
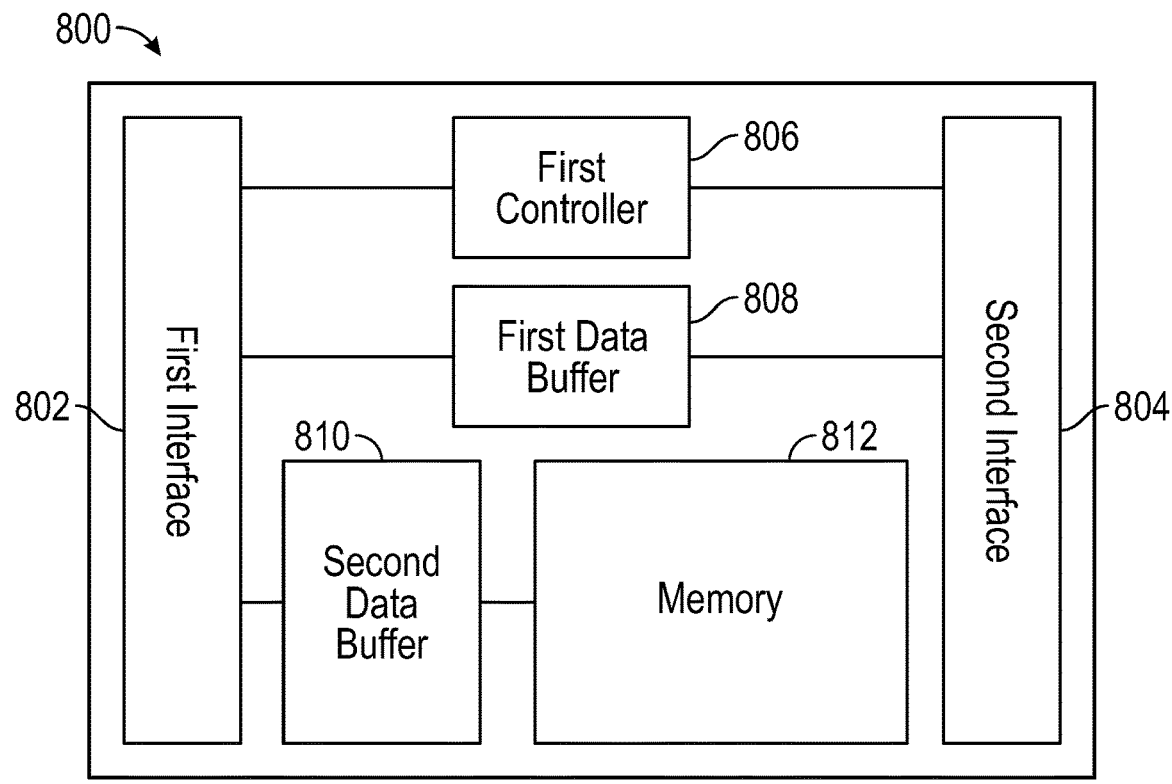
FIG. 8 illustrates an exemplary memory controller, in accordance with an embodiment.

FIG. 8 illustrates an exemplary memory controller 800, in accordance with an embodiment. In some embodiments, the memory controller 800 comprises a first interface 802, a second interface 804, a first controller 806, a first data buffer 808, a second data buffer 810, and a memory 812.

In some embodiments, the memory controller 800 is included in at least one of an edge-AI system, a neural-network system, an internet-of-things system, an automotive electronics system, microcontroller system, a mobile communication system, a programmable computing system, a hardware security system, a telematics system, a biomedical electronics device, a robot, and a drone.

In some embodiments, memory controller 800 provides interfaces for accessing memory (not shown) of a host associated with dynamic data and comprises a memory (e.g., memory 812, computing memory 100, computing memory 200, computing memory 1300) configured to store static data, minimizing bottlenecks associated with dynamic data access. As described further below, embodiments herein advantageously reduce static data and dynamic data contending for a same cache space. In some embodiments, dynamic data are data that change frequently during a computation task, such as temporary and intermediate results (e.g., training data in a neural network) and activation data (e.g., data changing with each step in a neural network computation). For example, write operations performed on these data are a substantial portion of the total operations (e.g., at least 1%). In some embodiments, static data are data that do not change as frequently (e.g., compared to dynamic data) or does not change at all during a computation task, such as algorithms, communication protocols, and neural network parameters. Write operation on static data is small compared to total operations (e.g., less than 1%).

As an exemplary advantage, by storing static data in a memory of the memory controller, memory bandwidth associated with dynamic data is increased because the host memory may no longer need to store static data, improving data access speed and performance of a system that includes the disclosed memory controller. For example, a neural network using the disclosed memory controller 800 would see a performance improvement because the memory of the memory controller may be used to store data that is adjusted infrequently, such as neural network model, and more memory (e.g., memory interfacing with the memory controller 800) may be used to store and update dynamic data, such as training data and intermediate computing results.

In some embodiments, the first interface 802 is a host interface. In some embodiments, the first interface 802 is configured for communication (e.g., first data transfer channel 906) between the memory controller 800 and a host (e.g., at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor). In some embodiments, the communication associated with the first interface 802 is a memory access channel type of one of double-data rate (DDRx), low-power double data rate (LPDDRx), graphics double data rate (GDDRx), high-bandwidth memory (HBM), and a high-speed memory access channel.

In some embodiments, the second interface 804 is a DRAM interface. In some embodiments, the second interface 804 is configured for communication (e.g., second data transfer channel 908) between the memory controller 800 and a first computing memory (e.g., memory 910, memory 1014) associated with a first data type. For example, the first computing memory is DRAM associated with dynamic data. In some embodiments, the second interface 804 is configured to couple to the first computing memory using through-silicon vias (TSVs) (e.g., in data transfer channel 908, TSV 1006), as described with respect to FIGS. 9 and 10. Although the second interface 804 is described as being a DRAM interface in an example, it is understood that the second interface 804 can be an interface for memories other than DRAM.

In some embodiments, the first computing memory is a high performance volatile memory. In some embodiments, a first computing memory associated with dynamic data stores the dynamic data in a sub-circuit comprising at least one of a volatile memory (e.g., SRAM, DRAM) and a non-volatile memory (e.g., MRAM, FLASH, PCM, FRAM, RRAM). In some examples, the selection of computing memory depends on frequency of write operation.

In some embodiments, the first controller 806 is a DRAM controller. In some embodiments, the first controller 806 is electrically coupled to the first interface 802 and the second interface 804 and is configured to issue commands (e.g., read command, write command) to a first computing memory (e.g., through the second interface 804). In some embodiments, the first controller 806 comprises a read buffer, a write buffer, and a command queue (e.g., a queue of commands associated with operations of the first computing memory). It is understood the illustrated connections for the first controller 806 are not meant to be limiting.

For example, the first controller 806 is configured to control DRAM electrically coupled to the memory controller 800 through the second interface 804. Although the first controller 806 is described as a DRAM controller in an example, it is understood that the first controller 806 can be a controller for memories other than DRAM.

In some embodiments, the first data buffer 808 is a DRAM buffer. In some embodiments, the first data buffer 808 is electrically coupled to the first interface 802 and the second interface 804. In some embodiments, the first data buffer is configured to transfer data of the first data type between the first interface 802 and the second interface 804. It is understood that the illustrated connections for the first data buffer 808 are not to be limiting. For example, in some embodiments, the first controller 806 and the first data buffer 808 are integrated together as one element of the memory controller 812.

For example, the first data buffer 808 is associated with a first data type (e.g., dynamic data). Although the first data buffer 808 is described as a DRAM buffer in an example, it is understood that the first data buffer 806 can be a buffer for memories other than DRAM.

In some embodiments, the first data buffer 808 comprises a read buffer and a write buffer associated with a first computing memory. In some embodiments, the read buffer stores and provides (e.g., to first interface 802) requested data (e.g., requested dynamic data) from the first computing memory before the requested data is provided to a host, and the write buffer stores and provides (e.g., to the second interface 804) data to be written (e.g., dynamic data to be written) in the first computing memory.

In some embodiments, the second data buffer 810 is a static data buffer. In some embodiments, the second data buffer 810 is electrically coupled to the memory 812 and the first interface 802. In some embodiments, the second data buffer is configured to transfer data of the second data type between the first interface 802 and the memory 812. It is understood the illustrated connections for the second data buffer 810 are not meant to be limiting. In some embodiments, the second data buffer 810 is associated with a second data type (e.g., static data).

In some embodiments, the second data buffer 810 comprises a read buffer and a write buffer associated with a second computing memory (e.g., memory 812). In some embodiments, the read buffer stores and provides (e.g., to first interface 802) requested data (e.g., requested static data) from the memory 812 before the requested data is provided to a host, and the write buffer stores and provides (e.g., to the memory 812) data to be written (e.g., static data to be written) in the first computing memory. In some embodiments, the read buffer of the second data buffer is larger than the write buffer of the second data buffer. In some embodiments, a frequency of write operation associated with static data is lower than a frequency of write operation associated with dynamic data. By reducing write buffer size in the second data buffer 810, power consumption and area are advantageously reduced.

In some embodiments, the second data buffer 810 comprises a buffer memory. In some embodiments, the data buffer is in a cache structure. As an exemplary advantage, by including a data buffer associated with a second data type (e.g., static data) in a cache structure, cache space related to a first data type (e.g., dynamic data) may be more freed up, and data access associated with dynamic data may be improved.

In some embodiments, the memory 812 is an internal memory. In some embodiments, the memory 812 is configured to store a second data type (e.g., static data). In some embodiments, the memory 812 comprises at least one of DRAM, flash memory, FRAM, RRAM, and MRAM. In some embodiments, the memory 812 comprises at least one of a non-volatile and a high-density memory. As an exemplary advantage, compared to volatile memories, a non-volatile memory generally consumes less stand-by power (e.g., power when the memory is not reading or writing) and have higher density.

In some embodiments, the second data type is defined by a host (at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor in an exemplary system). For example, the host of an exemplary system (e.g., edge-AI system, a neural-network system, an internet-of-things system, an automotive electronics system, microcontroller system, a mobile communication system, a programmable computing system, a hardware security system, a telematics system, a biomedical electronics device, a robot, and a drone) defines data being provided to the memory controller 812 or data provided by the memory controller 812 as static or dynamic (e.g., based on usage pattern, based on user defined algorithm, based on performance optimization, based on memory controller training). In some embodiments, the memory 812 and the computing memory (e.g., memory 910, memory 1014) are located on a same die, as described with respect to FIG. 10.

In some embodiments, the memory controller 800 includes an error correction code (ECC) and/or a data scrubbing circuit (not shown). Exemplary methods of data scrubbing and circuits for data scrubbing can be found in International Appln No. PCT/US2019/055963, the entirety of which is incorporated herein by reference in its entirety for all purposes. In some embodiments, a portion of the first computing memory (e.g., DRAM) may more likely fail or a portion of associated data may be more likely erroneous at higher temperatures. By adding the ECC and data scrubbing circuits into the memory controller, these higher temperature failures and errors may be advantageously detected and corrected without incurring performance and power consumption cost. Such performance and power consumption costs resulted from traditional solutions, for example, performing refresh of the first computing memory at a higher frequency to mitigate these higher temperature effects.

In some embodiments, the memory controller interface with the first computing memory (e.g., second interface, second data transfer channel 908, TSV 1006) is shorter and corresponding loading is smaller (e.g., TSV is lightweight), compared to conventional controller interfaces for communicating with a host memory (e.g., DRAM). The bandwidth, corresponding to a shorter interface and smaller loading, is higher, and the power consumption, corresponding to the shorter interface and smaller loading, is lower for transferring data to/from the first computing memory, the ECC, and/or data scrubbing circuit for correction and transferring the corrected data back to the first computing memory, making the addition of a ECC and/or data scrubbing circuit more feasible, compared to a convention memory controller. Therefore, some embodiments advantageously incorporate the ECC and data scrubbing circuit into the memory controller while optimizing performance and/or power consumption.

Although the memory controller 800 is described with respect to the elements illustrated on FIG. 8, it is understood that the descriptions are merely exemplary and not limiting. The memory controller may include different relationships between elements, additional elements, or less elements.

Figure 9:
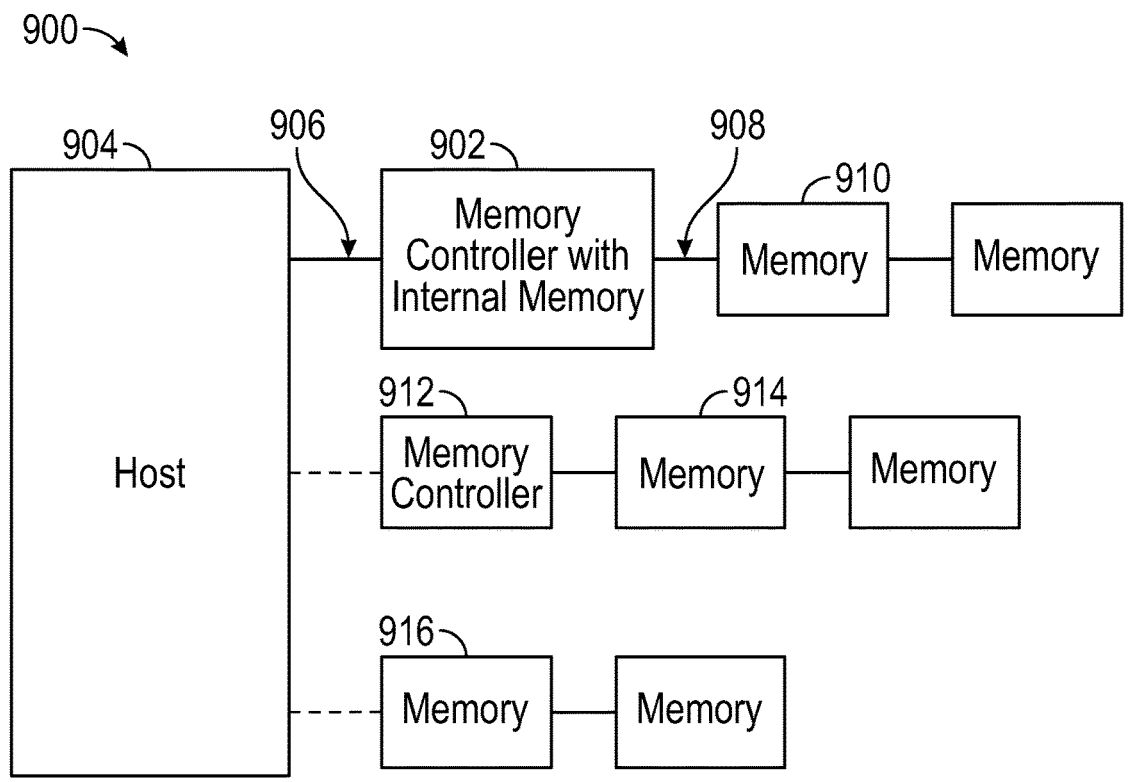
FIG. 9 illustrates an exemplary computing system, in accordance with an embodiment.

FIG. 9 illustrates an exemplary computing system 900, in accordance with an embodiment. In some embodiments, the computing system 900 comprises a first memory controller 902, a host 904, a first data transfer channel 906, a second data transfer channel 908, a second memory controller 912, and memories 910, 914, and 916. In some embodiments, the second memory controller 912 is a memory controller (e.g., first controller 806) associated with a first computing memory associated with a first data type (e.g., dynamic data).

In some embodiments, the memory controller 902 is memory controller 800. The memory controller 902 communicates with the host 904 through the first data transfer channel 906. In some embodiments, the first data transfer channel is a memory access channel type of one of double-data rate (DDRx), low-power double data rate (LPDDRx), graphics double data rate (GDDRx), high-bandwidth memory (HBM), and a high-speed memory access channel.

In some embodiments, the memory controller 902 communicates with memory 910 through the second data transfer channel 908. In some embodiments, the second data transfer channel 908 is created using through-silicon vias (TSVs).

In some embodiments, the memory controller 902 comprises an internal memory (e.g., memory 812, computing memory 100, computing memory 200) associated with a second data type (e.g., configured to store static data), and the memories 910, 914, and 916 are associated with a first data type (e.g., configured to store dynamic data). In some embodiments, the internal memory of the memory controller 902 and memory 910 are located on a same die.

In some embodiments, the internal memory of the memory controller 902 comprises at least one of DRAM, flash memory, FRAM, RRAM, MRAM, a non-volatile, and a high-density memory. In some embodiments, the memories 910, 914, and 916 comprises at least one of DRAM, high performance volatile memory, SRAM, flash memory, FRAM, and RRAM.

The computing system 900 may advantageously improve system performance associated with dynamic and static data access. By including the memory controller 902, static data may be stored in the memory controller 902, and memory bandwidth associated with dynamic data is increased because this memory may no longer need to store static data, improving data access speed and performance of a system that includes the disclosed memory controller. For example, the host 904 is part of a neural network using the memory controller 902 would see a performance improvement because the memory of the memory controller may be used to store data that is adjusted infrequently, such as neural network model, and more memory (e.g., memories 910, 914, and 916) may be used to store and update dynamic data, such as training data and intermediate computing results.

In some embodiments, the memory channels associated with memories 914 and 916 are associated with access of a first type of data (e.g., dynamic data). In some embodiments, because the memory controller 902 is configured to store a second type of data (e.g., static data), the memories 914 and 916 may be configured to exclusively store the first type of data, optimizing the bandwidth associated with these memories.

Although the computing system 900 is described with respect to the elements illustrated on FIG. 9, it is understood that the descriptions are merely exemplary and not limiting. The computing system may include different relationships between elements, additional elements, or less elements.

Figure 10:
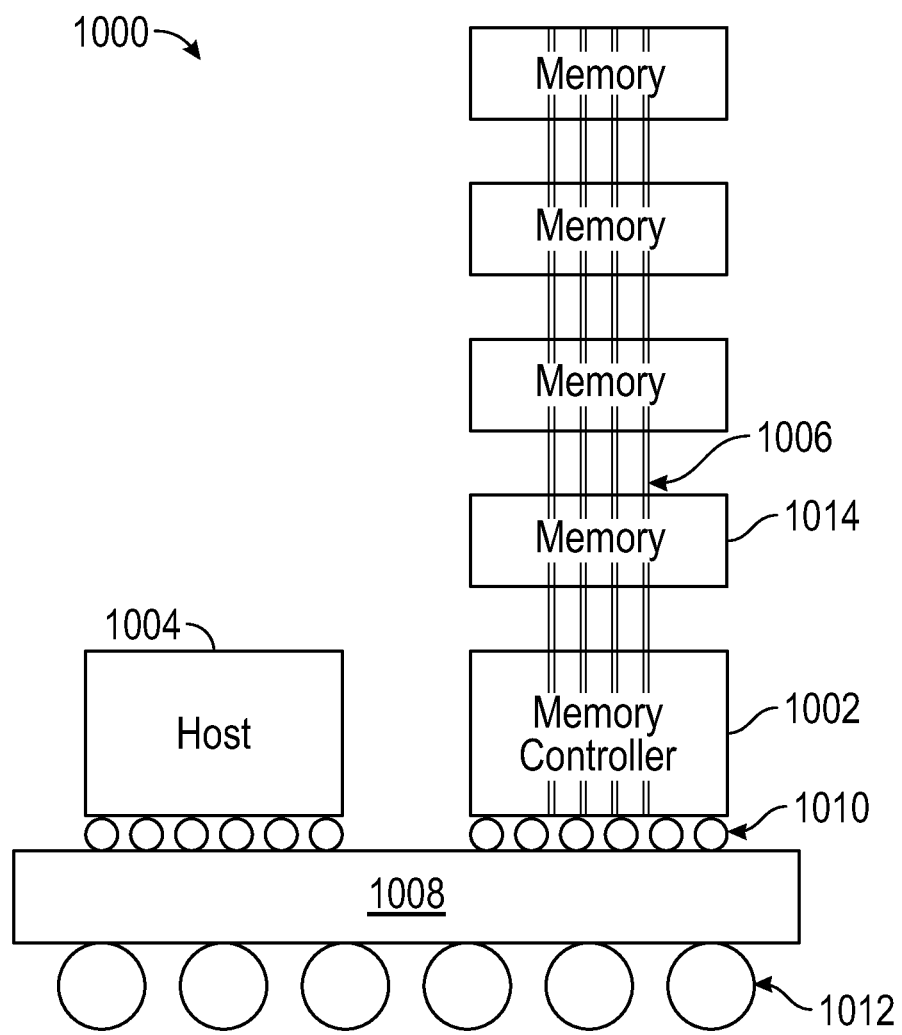
FIG. 10 illustrates an exemplary computing system, in accordance with an embodiment.

FIG. 10 illustrates an exemplary computing system 1000, in accordance with an embodiment. In some embodiments, the computing system 1000 comprises a memory controller 1002, a host 1004, an interposer 1008, and memory 1014. In some embodiments, the memory controller 1002 is the memory controller 800 or memory controller 902. In some embodiments, the computing system 1000 is electrically coupled to another system (e.g., to a circuit board of a system) through solder balls 1012.

In some embodiments, the memory controller 1002 communicates (e.g., second data transfer channel 908) with memory 1014 through through-silicon vias (TSVs) 1006. As an exemplary advantage, at least one memory 1014 may be stacked on top of the memory controller 1014, and both static data (e.g., from memory controller 1002) and dynamic data (e.g., memory 1014) may be accessed from the same stack up, reducing system area.

In some embodiments, the memory controller 1002 comprises an internal memory (e.g., memory 812, computing memory 100, computing memory 200) associated with a second data type (e.g., configured to store static data), and the memory 1014 is associated with a first data type (e.g., configured to store dynamic data). In some embodiments, the internal memory of the memory controller 1002 and memory 1014 are located on a same die.

In some embodiments, the internal memory of the memory controller 1002 comprises at least one of DRAM, flash memory, FRAM, RRAM, MRAM, a non-volatile, and a high-density memory. In some embodiments, the memory 1014 comprises at least one of DRAM, high performance volatile memory, SRAM, flash memory, FRAM, and RRAM.

As an exemplary advantage, by integrating the first computing memory and the second computing memory on a same die, memory array area (e.g., the arrays associated with the first and second computing memories are integrated on a same chip) and power consumption (e.g., less complexity and switching in the data paths of the computing memories) may be reduced, and memory access performance may improve (e.g., less complexity and switching in the data paths of the computing memories).

In some embodiments, the host 1004 is the host 904 or a host in communication with the memory controller 800. In some embodiments, the host 1004 is at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor in an exemplary system.

In some embodiments, the memory controller 1002 is in communication with the host 1004 through the interposer 1008. In some embodiments, the memory controller 1002 is electrically coupled to the interposer 1008 through a set of micro bumps 1010, and the host 1004 is electrically coupled to the interposer 1008 through a second set of micro bumps 1010. In some embodiments, the interposer 1008 is a solid-state device and is configured to electrically interface routing between a first socket or a first connection (e.g., associated with the memory controller 1002 and/or memory 1014) to a second socket (e.g., associated with the host 1004, a system electrically coupled to the computing system 1000) or a second connection.

Although the computing system 1000 is described with respect to the elements illustrated on FIG. 10, it is understood that the descriptions are merely exemplary and not limiting. The computing system may include different relationships between elements, additional elements, or less elements.

Figure 11:
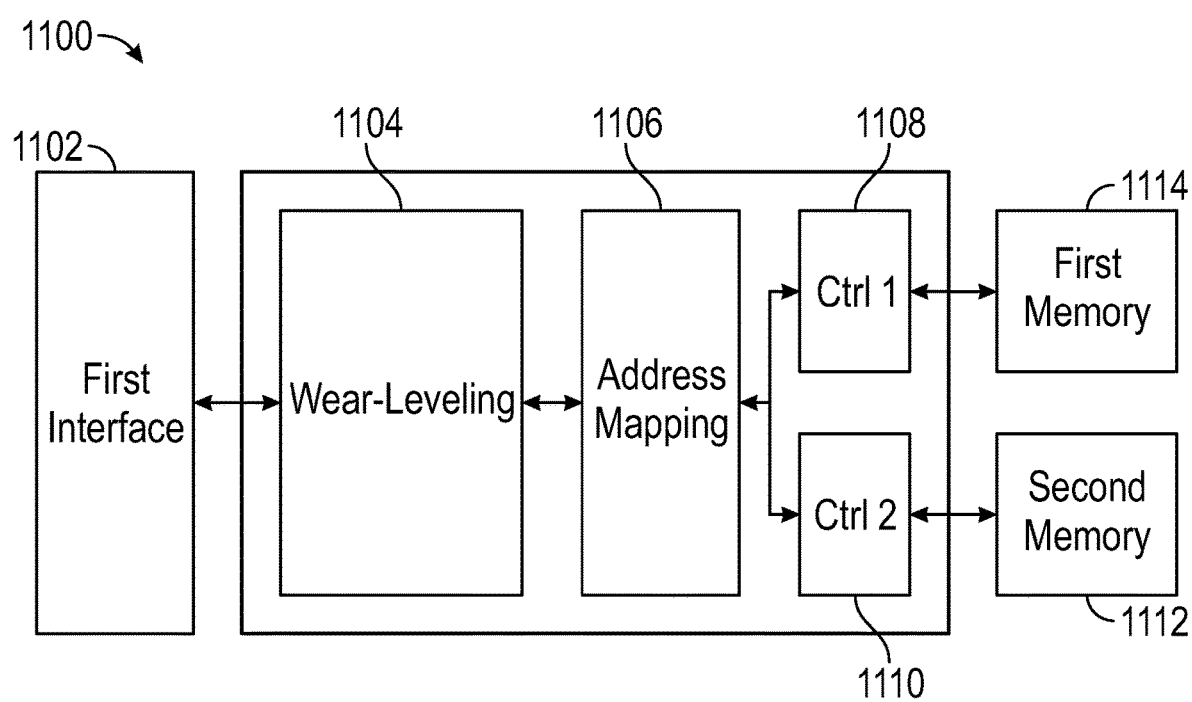
FIG. 11 illustrates an exemplary computing system, in accordance with an embodiment.

FIG. 11 illustrates an exemplary computing system 1100, in accordance with an embodiment. In some embodiments, elements (e.g., wear-leveling circuit 1104, address mapping block 1106) of the computing system 1100 are included in the memory controller 800, memory controller 902, and memory controller 1002. In some embodiments, the computing system 1100 is used to perform operations associated with computing memory 1300.

In some embodiments, the computing system 1100 comprises a first interface 1102, a wear-leveling circuit 1104, an address mapping block 1106, a first controller 1108, a second controller 1110, a second memory 1112, and a first memory 1114. In some embodiments, the first interface 1102 is first interface 802. In some embodiments, the first interface 802 comprises the wear-leveling circuit 1104 and the address mapping block 1106. In some embodiments, the second memory 1112 is memory 812 (e.g., memory associated with static data), and the first memory 1114 is memory 910, memory 914, memory 916, and/or memory 1014 (e.g., memory associated with dynamic data). In some embodiments, the first controller 1108 comprises first controller 806 and/or first data buffer 808 and is associated with a first data type (e.g., dynamic memory). In some embodiments, the second controller 1110 comprises second data buffer 810 and is associated with a second data type (e.g., static memory).

In some embodiments, the address mapping block 1106 comprises an address mapping table (e.g., a look-up table). In some embodiments, the address mapping block 1106 comprises a memory (e.g., volatile memory and/or non-volatile memory, as described herein) configured to store address mapping information. For example, address mappings are self-learned (e.g., self-trained by the computing memory based on access patterns, the access patterns are recorded, using other methods disclosed herein), and the self-learned address mappings are stored in an internal memory (e.g., non-volatile memory, memory 812). As an exemplary advantage, by storing self-learned information in a non-volatile memory of a computing memory system, the self-learned information can be stored without power, and the learned information does not need to be relearned or rewritten after each power-on, advantageously improving performance and reducing power consumption related to the memory access self-learning process. Furthermore, chip area is advantageously saved because non-volatile memory generally requires less area per byte than other memory types, for example, SRAM.

In some embodiments, the address mapping block 1106 receives a first memory address (e.g., a logic address, an address provided by the host) from a host (e.g., host 904, host 1004). Based on the address mapping table of the address mapping block 1106, a second memory address (e.g., a physical address, an actual address of a computing memory) is provided to the first controller 1108 and/or second controller 1110, depending on the location of the second memory address. The first controller 1108 and/or the second controller 1110 issue commands corresponding to access of data at the second memory address.

In some embodiments, the first memory address is associated with a first data type (e.g., dynamic data), and the second memory address is associated with a second data type (e.g., static data). In some embodiments, the association of the first memory address with the first data type is made by a host providing the first memory address (e.g., the host does not need to know the memory controller is actually accessing the second memory address).

In some embodiments, the first memory address is associated with a second data type (e.g., static data), and the second memory address is associated with a second data type (e.g., dynamic data). In some embodiments, the association of the first memory address with the second data type is made by a host providing the first memory address (e.g., the host does not know the memory controller is actually accessing the second memory address).

In some embodiments, the wear-leveling circuit 1104 is configured to update the address mapping table. For example, a first address is mapped to a second address on the address mapping table, and in response to receiving a request to update the address mapping table, the wear-leveling circuit 1104, updates a mapping of the first address to a third address, different from the second address (e.g., by updating data stored in a memory of the address mapping block 1106). In some embodiments, the request to update the address mapping table is from a host. In some embodiments, the request is generated based on a detection of extensive write operations at a memory address or a detection non-repairable defects at a memory address. In some embodiment, the request to update the address mapping table is generated based on at least one of usage pattern, user defined algorithm, performance optimization, and memory controller training.

In some embodiments, the first memory 1114 and the second memory 1112 comprises a same type of memory (e.g., MRAM, DRAM, flash memory, FRAM, RRAM). Specifically, in some embodiments, the first memory 1114 and the second memory 1112 comprises MRAM, and in some instances, memories such as MRAM have limited cycle endurance. As an exemplary advantage, with a "FLASH translation layer" (e.g., the wear-leveling circuit 1104 and/or the address mapping block 1106) added to a memory controller, write operations on the memories may be more evenly distributed, extending the lifetime of the memories (e.g., by orders of magnitude). For example, to evenly distribute the write operations, a first memory associated with static data may be written, in lieu of a second memory associated with dynamic data, extending the lifetime of the second memory.

Although the computing system 1100 is described with respect to the elements illustrated on FIG. 11, it is understood that the descriptions are merely exemplary and not limiting. The computing system may include different relationships between elements, additional elements, or less elements.

Figure 12:
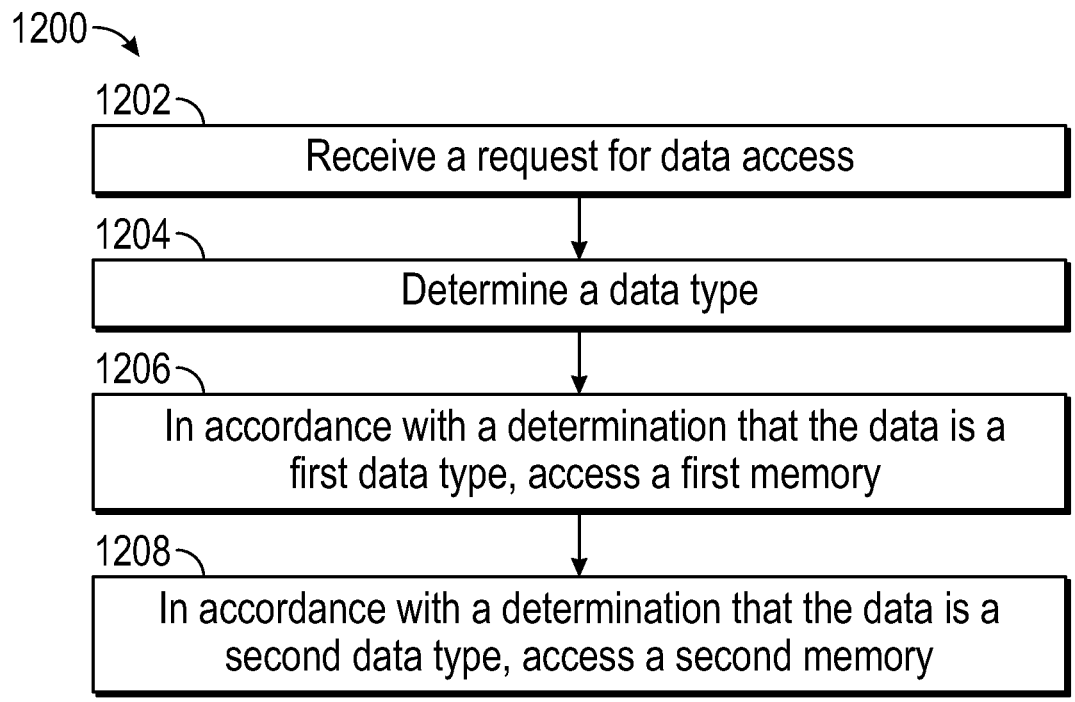
FIG. 12 illustrates an exemplary method of operating a memory, in accordance with an embodiment.

FIG. 12 illustrates an exemplary method 1200 of operating a memory controller, in accordance with an embodiment. Although the method 1200 is illustrated as including the described steps, it is understood that different order of steps, additional steps, or less steps may be performed to operate the exemplary memory controller without departing from the scope of the disclosure. It is also understood that the method 1200 may be performed with other methods disclosed herein.

In some embodiments, the method 1200 comprises receiving a request for data access (step 1202). For example, a first interface 802 receives instructions from a host to access (e.g., read, write) a computing memory. In some embodiments, the instructions and the data (e.g., data provided for write, data provided from read) is communicated over a memory access channel type of one of double-data rate (DDRx), low-power double data rate (LPDDRx), graphics double data rate (GDDRx), high-bandwidth memory (HBM), and a high-speed memory access channel.

In some embodiments, the method 1200 comprises determining a data type associated with the data being accessed (step 1204). For example, the data type is static data or dynamic data, as described herein. In some embodiments, the data type is defined by a host, as described herein.

In some embodiments, the method 1200 comprises in accordance with a determination that the data is a first data type, accessing a first memory (step 1206). For example, in accordance with a determination (e.g., by a host, by a memory controller) that the data is dynamic data, the first computing memory (e.g., memory 910, memory 1014) is accessed by the memory controller (e.g., memory controller 800, memory controller 902, memory controller 1002).

In some embodiments, the first computing memory is at least one of DRAM, high performance volatile memory, SRAM, flash memory, FRAM, and RRAM.

In some embodiments, the method 1200 comprises in accordance with a determination that the data is a second data type, accessing a second memory (step 1208). For example, in accordance with a determination (e.g., by a host, by a memory controller) that the data is static data, the second computing memory (e.g., memory 812) is accessed by the memory controller (e.g., memory controller 800, memory controller 902, memory controller 1002).

In some embodiments, the second computing memory is at least one of DRAM, flash memory, FRAM, RRAM, MRAM, a non-volatile, and a high-density memory.

In some embodiments, the method 1200 comprises mapping a first memory address to a second address according to a first address mapping. For example, the address mapping block 1106 comprises an address mapping table that includes the first address mapping, which maps a first memory address to a second memory address.

In some embodiments, the method 1200 comprises in response to receiving a request to access data at the first memory address, accessing the second memory address. For example, when a host (e.g., host 904, host 1004) requests for data at the first memory address from a memory controller (e.g., memory controller 800, memory controller 902, memory controller 1002), based on the first address mapping (e.g., from address mapping block 1106), the memory controller accesses data at the second memory address.

In some embodiments, the method 1200 comprises updating a first address mapping to a second address mapping. For example, wear-leveling circuit 1104 updates a first address mapping (e.g., maps a first memory address to a second memory address) to a second address mapping (e.g., maps a first memory address to a third memory address). In some embodiments, the update from the first address mapping to the second address mapping is performed in response to a receiving a request to update the address mapping. In some embodiments, the request is generated based on at least one of usage pattern, user defined algorithm, performance optimization, and memory controller training.

In some embodiments, the first memory address is associated with a first data type (e.g., dynamic data), and the second memory address is associated with a second data type (e.g., static data). For example, to evenly distribute write operations, a first memory associated with static data may be written, in lieu of a second memory associated with dynamic data, advantageously extending the lifetime of the second memory.

Figure 13:
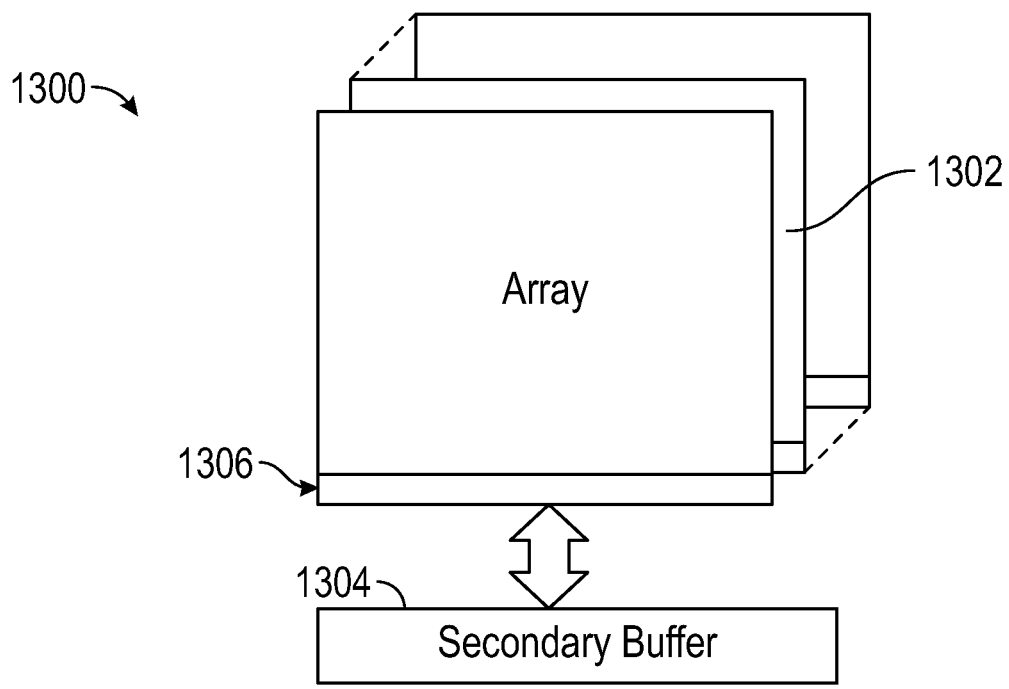
FIG. 13 illustrates an exemplary memory, in accordance with an embodiment.

FIG. 13 illustrates an exemplary memory 1300, in accordance with an embodiment. In some embodiments, the computing memory 1300 comprises memory array 1302, secondary buffer 1304, and sensing circuits 1306. In some embodiments, the computing memory 1300 is combined with elements of computing memory 100 or computing memory 200. In some embodiments, the computing memory 1300 is combined with elements of memory controller 800, computing system 900, computing system 1000, or computing system 1100.

In some embodiments, the computing memory 1300 is included in at least one of an edge-AI system, a neural-network system, an internet-of-things system, an automotive electronics system, microcontroller system, a mobile communication system, a programmable computing system, a hardware security system, a telematics system, a biomedical electronics device, a robot, and a drone.

In some embodiments, the computing memory 1300 is configured to operate in more than one mode. In some embodiments, the computing memory 1300 is configured to operate in at least one of a page mode, a random-access mode, and a streaming mode. In some embodiments, the operation of the computing memory 1300 is configured to change in response to receiving an input; in response to the input, the operation of the computing memory 1300 changes from a first mode to a second mode.

For example, the first mode is at least one of a page mode, a random-access mode, and a streaming mode, and the second mode is at least one of the page mode, the random-access mode, and the streaming mode. As an example, in the first mode, the computing memory is operating in one of a page mode, a random-access mode, and a streaming mode, and in the second mode, the computing memory is operating in one of the page mode, the random-access mode, and the streaming mode, different from the first mode. As another example, in the first mode, a first portion of the computing memory may be operating in one of a page mode, a random-access mode, and a streaming mode, and a second portion of the computing memory in one of the page mode, the random-access mode, and the streaming mode, and in the second mode, the first portion of the computing memory may be operating in one of the page mode, the random-access mode, and the streaming mode, and the second portion of the computing memory in one of the page mode, the random-access mode, and the streaming mode. When operating in any of these modes, the computing memory may be performing a reading or writing operation associated with the respective modes.

In some embodiments, the input to change the operation of the computing memory from the first mode to the second mode is based on a usage pattern (e.g., spatial locality, temporal locality), based on command frequency, based on frequency of address sequences, or based on operation criticality of the computing memory. In some embodiments, the input to change the operation is determined by the computing memory (e.g., without an explicit instruction from a host). In some embodiments, based on a usage pattern (e.g., spatial locality, temporal locality), based on command frequency, based on frequency of address sequences, or based on operation criticality, the computing memory 1300 advantageously determines a sequence of operation modes, associated operating parameters (e.g., page size, data word size), address mappings, memory controller scheduling policy, clock frequencies, and power modes to optimize system performance related to memory access. In some embodiments, these configurations are stored in the computing memory 1300, in a separate computing memory, or in another device (e.g., a host). In some embodiments, optimization of the computing memory 1300 operation (e.g., determination of which modes to operate in, determination of operating parameters, determination of address mapping) is evaluated periodically or when a request for optimization is received.

As an exemplary advantage, in some embodiments, the computing memory 1300 comprises MRAM, and by having the ability to switch between different operating modes, the computing memory 1300 enables a standalone MRAM chip to circumvent the limitations of the processor-memory interface and achieve performance-power metrics more closely to an embedded memory solution.

As another exemplary advantage, the computing memory 1300 enables a better memory system architecture (e.g., by having a more integrated system) where memory controller, MRAM, and DRAM (e.g., the memory array 1302 comprises different kinds of bitcells) may work together and adapt to complex data structures and application demands (e.g., in neural network applications), yielding exponential system-level performance improvements.

In some embodiments, the page mode is associated with a first page size of the computing memory 1300, when the computing memory 1300 is operating in the page mode, in response to receiving the input to change the page size associated with the page mode, the computing memory 1300 is configured to associate a second page size with the page mode. For example, the page sizes and boundaries are programmable, such that the second page size is smaller than the first page size, advantageously reducing unused data and latency associated with a larger page size or larger page boundaries. In some embodiments, the first page size is a predetermined page size (e.g., a page size associated with DRAM, an entire row of bitcells accessed together) corresponding to a predetermined address location, and the second page size is a programmable page size corresponding to a programmable address location. In some embodiments, a page size and parameters associated with page size are stored in a register or memory (e.g., a non-volatile register, a non-volatile memory) of the computing memory 1300.

For example, the page size and parameters are self-learned (e.g., self-trained by the computing memory based on access patterns, the access patterns are recorded, using other methods disclosed herein), and the self-learned page size and parameters are stored in an internal memory (e.g., non-volatile memory, memory 812). As an exemplary advantage, by storing self-learned information in a non-volatile memory of a computing memory system, the self-learned information can be stored without power, and the learned information do not need to be relearned or rewritten after each power-on, advantageously improving performance and reducing power consumption related to the memory access self-learning process. Furthermore, chip area is advantageously saved because non-volatile memory generally requires less area per byte than other memory types, for example, SRAM.

In some embodiments, when the computing memory is operating in the page mode, in response to receiving the column command, the computing memory 1300 is configured to access (e.g., read, write) data words associated with the column command on an activated page.

In some embodiments, when the computing memory is operating in the page mode, the computing memory 1300 is configured to access (e.g., read, write) an activated page (e.g., a page of a predetermined page size, a page of programmable page size). In some embodiments, when the computing memory is operating in the page mode, a first portion of a page is in an activated state (e.g., for reading, for writing, for other access), and a second portion of the page is in a precharged state (e.g., standby).

In some embodiments, when the computing memory 1300 is operating in the random-access mode, a data word (e.g., instead of a page) being accessed has a programmable size. In some embodiments, the data word has a size between 1 bit and 1024 bits. In some embodiments, the data word size is predetermined or programmed (e.g., by a host, by training, based on usage patterns (e.g., spatial locality, temporal locality), based on operation criticality). For example, depending on a word size associated with requested data from a host (e.g., at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor), the computing memory 1300 advantageously adjust the data word size to optimize access time and power consumption related to the requested data. In some embodiments, methods of operating computing memory 100 or computing memory 200 are used to advantageously quickly access data when the computing memory 1300 is operating in the random-access mode.

In some embodiments, the computing memory 1300 is operating in the streaming mode, and the computing memory 1300 is configured to be accessed (e.g., read, write) using a programmable address sequence associated with a data stream (e.g., the data is continuously accessed). As an exemplary advantage, by programming an address sequent associated with a data stream in the streaming mode, page activation does not need to be used, and high bandwidth output on complex data structure may be achieved without invoking unnecessary data read operations (e.g., the programed addresses are associated with access of only the necessary data). In some embodiments, the computing memory 1300 is operating in the streaming mode, and the computing memory 1300 is configured to be accessed (e.g., read, write) using a predetermined address sequence associated with a data stream stored in the computing memory (e.g., the data is continuously accessed). In some embodiments, the predetermined or programmed address is stored in the computing memory 1300 (e.g., in a non-volatile memory of the computing memory 1300) before access to the memory in the streaming mode is initiated.

For example, the predetermined or programmed address sequences are self-learned (e.g., self-trained by the computing memory based on access patterns, the access patterns are recorded, using other methods disclosed herein), and the predetermined or programmed address sequences are stored in an internal memory (e.g., non-volatile memory, memory 812). As an exemplary advantage, by storing self-learned information in a non-volatile memory of a computing memory system, the self-learned information can be stored without power, and the learned information do not need to be relearned or rewritten after each power-on, advantageously improving performance and reducing power consumption related to the memory access self-learning process. Furthermore, chip area is advantageously saved because non-volatile memory generally requires less area per byte than other memory types, for example, SRAM.

Specifically, in some instances, when the computing memory is in the streaming mode (e.g., used in larger neural-network models), the sequence of addresses may be a large data set. Loading these sequences when the memory is powered up may take time, potentially offsetting gains from optimizing streaming sequence (e.g., for low-power edge chip set). Using non-volatile memory to store the sequence advantageously reduces or eliminates this delay and reduces power consumption associated with accessing a sequence of addresses.

In some embodiments, addresses associated with the computing memory 1300 can be remapped (e.g., using elements of computing memory 1100). For example, the computing memory 1300 receives a first address associated with a requested data stored in the computing memory, and the computing memory 1300 accesses data at a second address, different from the first address; the requested data is stored at the second address of the computing memory, and the received first address is mapped to the second address of the computing memory (e.g., using address mapping block 1106, determined based on wear-leveling circuit 1104). In some embodiments, mapping the first address to the second address based on a usage pattern (e.g., through training (e.g., self-training), user input, analysis of usage pattern (e.g., spatial locality, temporal locality)), based on command frequency, based on frequency of address sequences, or based on operation criticality of the computing memory (e.g., to optimize access performance, to hide complexity from a memory controller and improve its performance, to increase the lifetime of the memory array 1302). For example, by recording usage patterns to identify frequently used command and/or address sequences and data blocks, the computing memory 1300 rearranges an address mapping to advantageously achieve higher performance and lower power by leveraging the non-volatility and logic CMOS platform (e.g., of a MRAM system). In some embodiments, the address mapping is programmed by a host or a memory controller (e.g., over an interface). In some embodiments, the address mapping is programmed by the computing memory 1300.

In some embodiments, when the computing memory 1300 is in the page mode or in the random-access mode, the computing memory 1300 is configured to prefetch data words. For example, the computing memory 1300 is configured to prefetch data words prior to receiving a column command associated with the data words. As another example, data are provided without an input from a host accessing the computing memory (e.g., prior to the host requesting for the data output). The data output may be predetermined based on previous access pattern and memory controller training, allowing memory to be accessed more quickly and improving system performance. In some embodiments, locations of the prefetched data words are at least one of predetermined by a host accessing the computing memory, programmed by the host, and stored in the computing memory (e.g., a non-volatile memory, memory 812).

For example, the locations of the prefetched data are self-learned (e.g., self-trained by the computing memory based on access patterns, the access patterns are recorded, using other methods disclosed herein), and the locations of the prefetched are stored in an internal memory (e.g., non-volatile memory, memory 812). As an exemplary advantage, by storing self-learned information in a non-volatile memory of a computing memory system, the self-learned information can be stored without power, and the learned information do not need to be relearned or rewritten after each power-on, advantageously improving performance and reducing power consumption related to the memory access self-learning process. Furthermore, chip area is advantageously saved because non-volatile memory generally requires less area per byte than other memory types, for example, SRAM.

In some embodiments, the memory array 1302 comprises at least one of MRAM, DRAM, SRAM, RRAM, FRAM, flash memory, and PCM. In some embodiments, the memory array 1302 comprises at least one memory bank.

In some embodiments, the secondary buffer 1304 is configured to store data accessed from the memory array 1302 (e.g., sensed by sensing circuits 1306). In some embodiments, the secondary buffer 1304 is configurable, depending on the operation of the computing memory 1300 (e.g., modes of the computing memory). For example, when a portion of the computing memory 1300 is in the page mode, a corresponding portion (e.g., in some embodiments, the secondary buffer is divided into multiple portions, each corresponding to a respective operation mode) of the secondary buffer 1304 is configured as a page buffer or row buffer. When a portion of the computing memory 1300 is in the random-access mode, a corresponding portion of the secondary buffer 1304 is configured as a cache. When a portion of the computing memory 1300 is in the streaming mode, a corresponding portion of the secondary buffer 1304 is configured as in a first-in-first-out (FIFO) data buffer. As an exemplary advantage, when used in the computing memory 1300, a configurable secondary buffer allows requested data to be retrieved and leave unused data unread, reducing power consumption compared to row buffers that are configured to retrieve an entire row of data, with much of the data unused.

In some embodiments, the sensing circuits 1306 comprises sense amplifiers configured to sense or amplify voltages associated with states of accessed bit cells (e.g., data output). For example, the sensing circuits 1306 comprises latching I/O buffers or latching sense amplifiers. It is understood that the term "sense amplifier" is not meant to be limiting, and can mean any circuit or hardware that is configured to generate a data output corresponding to an accessed bitcell.

Figure 14:
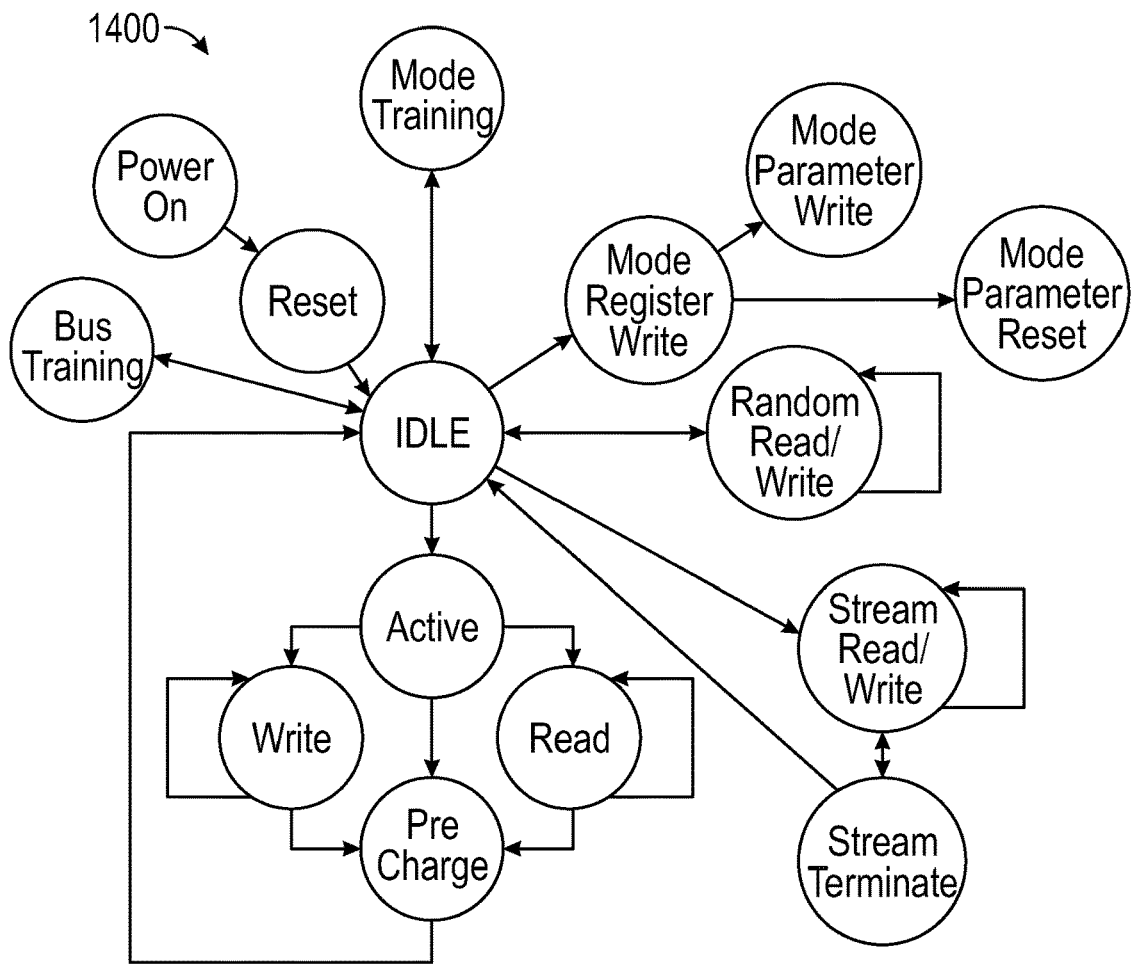
FIG. 14 illustrates an exemplary memory, in accordance with an embodiment.

FIG. 14 illustrates an exemplary memory 1400, in accordance with an embodiment. As illustrated, the computing memory 1400 is represented as a state diagram. In some embodiments, the state diagram represents exemplary states of the computing memory 1300.

As illustrated, the memory initiates after "power on" with a "reset" step. A "bus training" step and a "mode training" step (not shown) can be initiated to establish high-speed data connection with a host, as described herein. The memory then enters the "IDLE" state and wait for further commands from the host.

Operations associated with setting registers are performed when the memory receives a command from the host to enter "mode register write" state. In some embodiments, during the "mode register write" state, the memory will enter and return after several states related to modifying internal register values (e.g., to set register values). For example, these states include "mode parameter write" or "mode parameter reset". In some embodiments, the memory is configured to receive a command from the host to read the values on internal registers (not shown).

In some embodiments, from the "IDLE" state, the memory is configured to enter into a branch associated with an operating mode (e.g., random-access mode, streaming mode, page mode). In some embodiments, one of the operating modes is designated as a default mode.

In some embodiments, the memory is in a random-access mode, and the memory is configured to enter the state of "random read/write" and return to the "IDLE" state after completion of associated random data access commands. In some embodiments, the memory additionally internally performs (e.g., without an explicit external command) a prefetch operation; upon entering the "random read/write" state, the memory attempts to retrieve data from an internal cache.

In some embodiments, the memory is in a page mode, the memory enters into an "active" state by performing a page activation operation (e.g., "read," "write"), which includes reading a page (e.g., an entire row) of bit cells into a row buffer (e.g., secondary buffer 1304 configured as a row buffer or a page buffer) and writing (e.g., writing a page). From the "active" state, the memory is configured to enter and return from either "read" and "write" states (e.g., in response to receiving a corresponding "read" or "write" command). In some embodiments, to return to the "IDLE" state, the memory enters into a "precharge" state, where a precharge operation is performed in the memory. In some embodiments, the memory is an MRAM, a RRAM, a PCM, an FRAM, a FLASH memory, or other non-volatile memory, a precharge operation is skipped if no data on the page has changed by a write operation.

In some embodiments, the memory is in a streaming mode, the memory enters into a "stream read/write" state after receiving a read or a write command associated with the streaming mode. In this mode, the memory continuously read or write data from/to bitcells until the operation associated with the command is terminated. In some embodiments, the streaming read/write operation is terminated when a predetermined address is reached, when a predetermined length of address sequences is reached, when an end of an address sequence is reached, or when a command from a host to terminate is received. In some embodiments, the predetermined addresses, the predetermined length of address sequences, or the address sequence is stored in an internal memory (e.g., memory 812, a non-volatile memory) or register. After the streaming read/write operation terminates, the memory enters into a "stream terminate" state. From the "stream terminate", the memory returns to the "IDLE" state.

In some embodiments, the memory enters a "mode training" state. In some embodiments, in this state, memory access patterns are recorded, optimizing a self-learning algorithm (e.g., embedded in the computing memory) a prefetch address sequence, a page size, a streaming address sequence, address mapping, and other parameters. In some embodiments, the result of the algorithm is stored in an internal memory (e.g., memory 812, a non-volatile memory). In some embodiments, the "mode training" state is entered in response to a command from a host, in response to an operation switch, or in response to an internal trigger (e.g., from the computing memory). In some embodiments, the internal trigger is set by periodically recording an operational efficiency associated with a number of commands and comparing the recorded efficiency to a predetermined set point.

Figure 15:
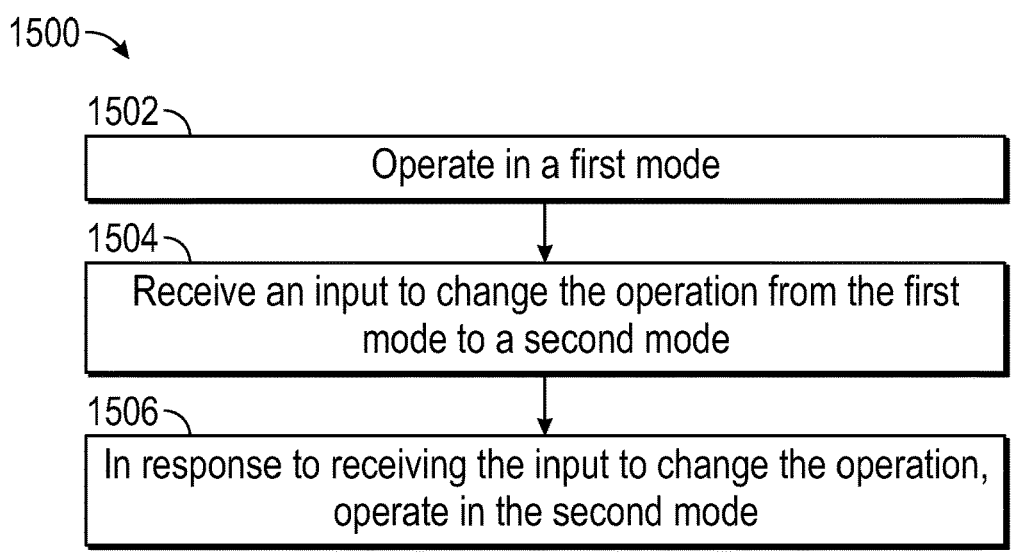
FIG. 15 illustrates an exemplary method of operating a memory, in accordance with an embodiment.

FIG. 15 illustrates an exemplary method 1500 of operating a memory, in accordance with an embodiment. Although the method 1500 is illustrated as including the described steps, it is understood that different order of steps, additional steps, or less steps may be performed to operate the exemplary computing memory without departing from the scope of the disclosure. It is also understood that the method 1500 may be performed with other methods disclosed herein. In some embodiments, the method 1500 is used to operate the computing memory 100, 200, 812, 1300.

In some embodiments, the method 1500 comprises operating a memory in a first mode (step 1502). For example, the computing memory 1300 is operating in at least one of a page mode, a random-access mode.

In some embodiments, the method 1500 comprises receiving, while operating in the first mode, an input to change the operation of the computing memory from the first mode to a second mode (step 1504). For example, the computing memory 1300 is operating in at least one of a page mode, a random-access mode and receives an input to operate in different modes.

In some embodiments, the method 1500 comprises in response to receiving the input to change the operation of the computing memory from the first mode to the second mode, operating the computing memory in the second mode, different from the first mode (step 1506). In some embodiments, the first mode is at least one of a page mode, a random-access mode, and a streaming mode, and the second mode is at least one of the page mode, the random-access mode, and the streaming mode.

As an example, in the first mode, the computing memory 1300 is operating in one of a page mode, a random-access mode, and a streaming mode, and in the second mode, the computing memory is operating in one of the page mode, the random-access mode, and the streaming mode, different from the first mode. As another example, in the first mode, a first portion of the computing memory may be operating in one of a page mode, a random-access mode, and a streaming mode, and a second portion of the computing memory one of the page mode, the random-access mode, and the streaming mode, and in the second mode, the first portion of the computing memory may be operating in one of the page mode, the random-access mode, and the streaming mode, and the second portion of the computing memory one of the page mode, the random-access mode, and the streaming mode. When operating in any of these modes, the computing memory may be performing a reading or writing operation associated with the respective modes.

In some embodiments, the input to change the operation of the computing memory 1300 from the first mode to the second mode is based on a usage pattern (e.g., spatial locality, temporal locality), based on command frequency, based on frequency of address sequences, or based on operation criticality of the computing memory. In some embodiments, the input to change the operation is determined by the computing memory (e.g., without an explicit instruction from a host). In some embodiments, based on a usage pattern (e.g., spatial locality, temporal locality), based on command frequency, based on frequency of address sequences, or based on operation criticality, the computing memory 1300 advantageously determines a sequence of operation modes, associated operating parameters (e.g., page size, data word size), address mappings, memory controller scheduling policy, clock frequencies, and power modes to optimize system performance related to memory access. In some embodiments, these configurations are stored in the computing memory 1300, in a separate computing memory, or in another device (e.g., a host). In some embodiments, optimization of the computing memory 1300 operation (e.g., determination of which modes to operate in, determination of operating parameters, determination of address mapping) is evaluated periodically or when a request for optimization is received.

As an exemplary advantage, in some embodiments, the computing memory 1300 comprises MRAM, and by having the ability to switch between different operating modes, the computing memory 1300 enables a standalone MRAM chip to circumvent the limitations of the processor-memory interface and achieve performance-power metrics more closely to an embedded memory solution.

As another exemplary advantage, the computing memory 1300 enables a better memory system architecture (e.g., by having a more integrated system) where memory controller, MRAM, and DRAM (e.g., the memory array 1302 comprises different kinds of bitcells) may work together and adapt to complex data structures and application demands (e.g., in neural network applications), yielding exponential system-level performance improvements.

In some embodiments, the page mode is associated with a first page size of the computing memory, the method 1500 further comprises, when the computing memory is operating in the page mode, receiving an input to change the page size associated with the page mode, in response to receiving the input to change the page size associated with the page mode, associating a second page size with the page mode. For example, the page sizes and boundaries (e.g., of the computing memory 1300) are programmable, such that the second page size is smaller than the first page size, advantageously reducing unused data and latency associated with a larger page size or larger page boundaries. In some embodiments, the first page size is a predetermined page size (e.g., a page size associated with DRAM, an entire row of bitcells accessed together) corresponding to a predetermined address location, and the second page size is a programmable page size corresponding to a programmable address location.

In some embodiments, the method 1500 comprises, when the computing memory is operating in the page mode, receiving a column command, and in response to receiving the column command, accessing (e.g., read, write) data words associated with the column command on an activated page (e.g., of the computing memory 1300).

In some embodiments, the method 1500 comprises when the computing memory is operating in the page mode, accessing (e.g., read, write) an activated page (e.g., a page of a predetermined page size, a page of programmable page size) (e.g., of the computing memory). In some embodiments, when the computing memory is operating in the page mode, a first portion of a page is in an activated state (e.g., for reading, for writing, for other access), and a second portion of the page is in a precharged state (e.g., standby).

In some embodiments, when the computing memory is operating in the random-access mode, a data word (e.g., instead of a page) being accessed has a programmable size. In some embodiments, the data word has a size between 1 bit and 1024 bits. In some embodiments, the method 1500 comprises predetermining or programming (e.g., by a host, by training the data word size based on usage patterns (e.g., spatial locality, temporal locality), based on operation criticality). For example, depending on a word size associated with requested data from a host (e.g., at least one of a central processing unit (CPU), a graphics processing unit (GPU), a field-programmable gate array (FPGA), a digital signal processor (DSP), an accelerator integrated circuit (IC), an application-specific integrated circuit (ASIC), a processor), the computing memory 1300 advantageously adjust the data word size to optimize access time and power consumption related to the requested data. In some embodiments, methods of operating computing memory 100 or computing memory 200 are used to advantageously quickly access data when the computing memory 1300 is operating in the random-access mode.

In some embodiments, the computing memory is operating in the streaming mode, and the method 1500 comprises accessing (e.g., read, write) the computing memory (e.g., computing memory 1300) using a programmable address sequence associated with a data stream (e.g., the data is continuously accessed). As an exemplary advantage, by programming an address sequent associated with a data stream in the streaming mode, page activation does not need to be used, and high bandwidth output on complex data structure may be achieved without invoking unnecessary data read operations (e.g., the programed addresses are associated with access of only the necessary data). In some embodiments, the computing memory 1300 is operating in the streaming mode, and the computing memory 1300 is configured to be accessed (e.g., read, write) using a predetermined address sequence associated with a data stream stored in the computing memory (e.g., the data is continuously accessed). In some embodiments, the predetermined or programmed address is stored in the computing memory 1300 (e.g., in a non-volatile memory of the computing memory 1300) before access to the memory in the streaming mode is initiated.

In some embodiments, the method 1500 comprises remapping addresses associated with the computing memory (e.g., using elements of computing memory 1100, steps of method 1200). For example, the computing memory 1300 receives a first address associated with a requested data stored in the computing memory, and the computing memory 1300 accesses data at a second address, different from the first address; the requested data is stored at the second address of the computing memory, and the received first address is mapped to the second address of the computing memory (e.g., using address mapping block 1106, determined based on wear-leveling circuit 1104). In some embodiments, mapping the first address to the second address based on a usage pattern (e.g., through training (e.g., self-training), user input, analysis of usage pattern (e.g., spatial locality, temporal locality)), based on command frequency, based on frequency of address sequences, or based on operation criticality of the computing memory (e.g., to optimize access performance, to hide complexity from a memory controller and improve its performance, to increase the lifetime of the memory array 1302). For example, by recording usage patterns to identify frequently used command and/or address sequences and data blocks, the computing memory 1300 rearranges an address mapping to advantageously achieve higher performance and lower power by leveraging the non-volatility and logic CMOS platform (e.g., of a MRAM system). In some embodiments, the address mapping is programmed by a host or a memory controller (e.g., over an interface). In some embodiments, the address mapping is programmed by the computing memory 1300.

In some embodiments, when the computing memory is in the page mode or in the random-access mode, the method 1500 comprises prefetching data words (e.g., from the computing memory 1300). For example, the computing memory 1300 is configured to prefetch data words prior to receiving a column command associated with the data words. As another example, data are provided without an input from a host accessing the computing memory (e.g., prior to the host requesting for the data output). The data output may be predetermined based on previous access pattern and memory controller training, allowing memory to be accessed more quickly and improving system performance. In some embodiments, locations of the prefetched data words are at least one of predetermined by a host accessing the computing memory, programmed by the host, and stored in the computing memory (e.g., in an internal memory of the computing memory, in a non-volatile memory of the computing memory).

In some embodiments, a memory array of the computing memory associated with method 1500 comprises at least one of MRAM, DRAM, SRAM, RRAM, FRAM, flash memory, and PCM. In some embodiments, the memory array of the computing memory comprises at least one memory bank.

In some embodiments, the method 1500 comprises storing data, in a secondary buffer, accessed from a memory array of the computing memory. In some embodiments, the method 1500 comprises configuring the secondary buffer depending on the operation of the computing memory.

For example, the secondary buffer 1304 is configured to store data accessed from the memory array 1302 (e.g., sensed by sensing circuits 1306). In some embodiments, the secondary buffer 1304 is configurable, depending on the operation of the computing memory 1300 (e.g., modes of the computing memory). For example, when a portion of the computing memory 1300 is in the page mode, a corresponding portion (e.g., in some embodiments, the secondary buffer is divided into multiple portions, each corresponding to a respective operation mode) of the secondary buffer 1304 is configured as a page buffer or row buffer. When a portion of the computing memory 1300 is in the random-access mode, a corresponding portion of the secondary buffer 1304 is configured as a cache. When a portion of the computing memory 1300 is in the streaming mode, a corresponding portion of the secondary buffer 1304 is configured as in a first-in-first-out (FIFO) data buffer.

In some embodiments, the method 1500 comprises sensing, amplifying, or latching data being accessed in the computing memory. For example, the sensing circuits 1306 comprises sense amplifiers configured to sense or amplify voltages associated with states of accessed bit cells (e.g., data output). For example, the sensing circuits 1306 comprises latching I/O buffers or latching sense amplifiers.

Figure 16:
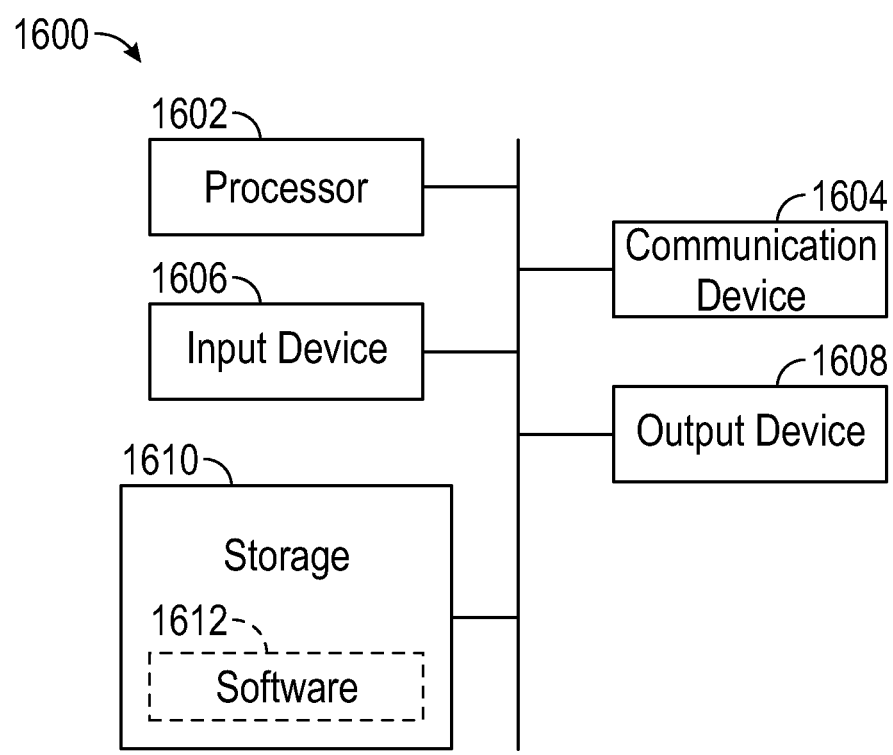
FIG. 16 illustrates an example of a computing device.

FIG. 16 illustrates an example of a computing device 1600, in accordance with an embodiment. In some embodiments, the device 1600 is configured to be coupled to the disclosed systems and is configured to perform the operational methods associated with the systems disclosed herein.

Device 1600 can be a host computer connected to a network. Device 1600 can be a client computer or a server. As shown in FIG. 16, device 1600 can be any suitable type of microprocessor-based device, such as a dedicated computing device, a personal computer, work station, server, handheld computing device (portable electronic device) such as a phone or tablet, an edge-AI device, or a neural network device. In some embodiments, the device 1600 comprises computing system 900 or 1000. The device can include, for example, one or more of processors 1602, input device 1606, output device 1608, storage 1610, and communication device 1604. Input device 1606 and output device 1608 can generally correspond to those described above and can either be connectable or integrated with the computer.

Input device 1606 can be any suitable device that provides input, such as a camera sensor, touchscreen, keyboard or keypad, mouse, or voice-recognition device. Output device 1608 can be any suitable device that provides output, such as an illuminator, a touchscreen, haptics device, or speaker.

Storage 1610 can be any suitable device that provides storage, such as an electrical, magnetic, or optical memory including a RAM, cache, hard drive, or removable storage disk. In some examples, the storage 1610 includes memory system 100, 200, 800, or 1300. Communication device 1604 can include any suitable device capable of transmitting and receiving signals over a network, such as a network interface chip or device. The components of the computer can be connected in any suitable manner, such as via a physical bus, or wirelessly.

Software 1612, which can be stored in storage 1610 and executed by processor 1610, can include, for example, the programming that embodies the functionality of the present disclosure (e.g., as embodied in the devices described above).

Software 1612 can also be stored and/or transported within any non-transitory, computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 1610, that can contain or store programming for use by or in connection with an instruction-execution system, apparatus, or device.

Software 1612 can also be propagated within any transport medium for use by or in connection with an instruction-execution system, apparatus, or device, such as those described above, that can fetch instructions associated with the software from the instruction-execution system, apparatus, or device and execute the instructions. In the context of this disclosure, a transport medium can be any medium that can communicate, propagate, or transport programming for use by or in connection with an instruction-execution system, apparatus, or device. The transport readable medium can include, but is not limited to, an electronic, magnetic, optical, electromagnetic, or infrared wired or wireless propagation medium.

Device 1600 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 1600 can implement any operating system suitable for operating on the network. Software 1612 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

Although "electrically coupled" and "coupled" are used to describe the electrical connections between two elements of the readout circuit in this disclosure, it is understood that the electrical connections do not necessarily need direct connection between the terminals of the components being coupled together. Different combinations and connections of the recited components can achieve a constant current and adjustable bias voltage readout circuit without departing from the scope of this disclosure. For example, electrical routing connects between the terminals of the components being electrically coupled together. In another example, a closed (conducting) switch (e.g., a transistor) is connected between the terminals of the components being coupled together. In yet another example, additional elements connect between the terminals of the components being coupled together without affecting the constant current characteristics of the circuit. For example, buffers, amplifiers, and passive circuit elements can be added without affecting the characteristics of the memory and departing from the scope of this disclosure.

Generally, as used herein, the term "substantially" is used to describe element(s) or quantit(ies) ideally having an exact quality (e.g., fixed, the same, uniformed, equal, similar, proportional), but practically having qualities functionally equivalent to the exact quality. For example, an element or quantity is described as being substantially fixed or uniformed can deviate from the fixed or uniformed value, as long as the deviation is within a tolerance of the system (e.g., accuracy requirements, etc.). As another example, two elements or quantities described as being substantially equal can be approximately equal, as long as the difference is within a tolerance that does not functionally affect a system's operation.

Likewise, although some elements or quantities are described in an absolute sense without the term "substantially", it is understood that these elements and quantities can have qualities that are functionally equivalent to the absolute descriptions. For example, in some embodiments, a ratio is described as being one. However, it is understood that the ratio can be greater or less than one, as long as the ratio is within a tolerance of the system (e.g., accuracy requirements, etc.).

In one aspect, a method of accessing a memory includes accessing a word line of a memory array; while accessing the word line of the memory array: accessing a first bit line corresponding to a sense amplifier; and accessing a second bit line corresponding to the sense amplifier; and sensing, with the sense amplifier, a first memory bitcell of the memory array at the word line and the first bit line.

In some aspects of the above method, the method further includes sensing, with the sense amplifier, a second memory bitcell of the memory array at the word line and the second bit line.

In some aspects of the above methods, the first memory bitcell and the second memory bitcell are sensed with the sense amplifier.

In some aspects of the above methods, accessing the second bit line comprises accessing the second bit line while accessing the first bit line.

In some aspects of the above methods, the method further includes generating, based on the sensed first memory bitcell, a first data output associated with a state of the first memory bitcell; and storing the first data output in a data buffer.

In some aspects of the above methods, the method further includes sensing a second memory bitcell of the memory array at the word line and the second bit line; generating, based on the sensed second memory bitcell, a second data output associated with a state of the second memory bitcell; and storing the second data output in the data buffer. A time difference between the storage of the first data output and the storage of the second data output is a delay between the sensing of the first memory bitcell and the sensing of the second memory bitcell.

In some aspects of the above methods, the word line and the first bit line are at a first address of the memory array, and the method further includes: receiving a memory address; determining whether the memory address is the first address; in accordance with a determination that the memory address is the first address, outputting the first data output from the data buffer; and in accordance with a determination that the memory address is not the first address, forgoing outputting the first data output from the data buffer.

In some aspects of the above methods, storing the first output in the data buffer comprises latching the first data output in the data buffer, and the method further comprises in response to latching the first data output, designating the first data output as ready, wherein outputting the first data output from the data buffer is further in accordance with a determination that the first data output is designated as ready.

In some aspects of the above methods, designating the first data output as ready comprises setting a tag bit associated with the first data output to a ready value.

In some aspects of the above methods, the first data output is prefetched, and the memory address is not received from a host accessing the memory.

In some aspects of the above methods, the method further includes: receiving a memory address; determining whether the memory address is a second address, different from the first address; in accordance with a determination that the memory address is the second address, updating an order of bit line access; and in accordance with a determination that the memory address is not the second address, forgoing updating the order of bit line access. The second bit line corresponding to the sense amplifier is accessed in response to the updating of the order of bit line access, and the second address at the word line and the second bit line of the memory array.

In some aspects of the above methods, the method further includes: determining whether the data output is latched in a data buffer; in accordance with a determination that the data output is not latched in a data buffer, designating the data output associated with the second address as not ready; and in accordance with a determination that the data output is latched in the data buffer, forgoing designating the data output associated with the second address as not ready. The second bit line corresponding to the sense amplifier is accessed further in response to designating the data output associated with the second address as not ready.

In some aspects of the above methods, designating the second data output as not ready comprises setting a tag bit associated with the second data output to a not ready value.

In some aspects of the above methods, the method further includes: generating a reference voltage; and sensing a second memory bitcell of the memory array at the word line and the second bit line. The sensing the first memory bitcell of the memory array comprises amplifying a difference between a developed voltage associated with a state of the first memory bitcell and the reference voltage; and sensing the second memory bitcell of the memory array comprises amplifying a difference between a developed voltage associated with a state of the second memory bitcell and the reference voltage.

In some aspects of the above methods, the method further includes: stopping generation of the reference voltage; and holding the reference voltage until sensing of the first memory bitcell and second memory bitcell is completed.

In some aspects of the above methods, the reference voltage is held using a capacitor.

In some aspects of the above methods, the method further includes, while accessing the word line of the memory array, sampling and holding a developed voltage associated with a state of the first memory bitcell.

In some aspects of the above methods, sampling and holding the developed voltage further comprises: using a sample and hold circuit; and reducing injected charge into the sample and hold circuit.

In some aspects of the above methods, the first and second memory bitcells are one of magnetoresistive random-access memory (MRAM) bitcells, dynamic random-access memory (DRAM), static random-access memory (SRAM), resistive random-access memory (RRAM), ferroelectric random-access memory (FRAM), flash memory, and phase-change memory (PCM).

In some aspects of the above methods, the first bit line belongs to a first column slice in the memory array; and the second bit line belongs to a second column slice in the memory array.

In some aspects of the above methods, a state of the first memory bit cell is associated with a first output word, and a state of the second memory bit cell is associated with a second output word.

In some aspects of the above methods, effective signal values of the first memory bitcell and the second memory bitcell indicate respective states of the first memory bitcell and the second memory bitcell.

In some aspects of the above methods, the effective signal value is one of effective resistance, charge, and output voltage.

In some aspects of the above methods, the memory is operating in a page mode, the method further includes: switching the operation of the memory from the page mode to a random access mode; accessing a second word line of the memory array; and while accessing the second word line of the memory array: accessing a third bit line corresponding to the sense amplifier; and forgoing accessing other bit lines corresponding to the sense amplifier.

In one aspect, a memory is configured to perform any of the above methods.

In some aspects of the above memory, the memory is included in one selected from an edge-AI system, a neural-network system, an internet-of-things system, an automotive electronics system, microcontroller system, a mobile communication system, a programmable computing system, a hardware security system, a telematics system, a biomedical electronics device, a robot, and a drone.

In one aspect, a memory controller includes: a first interface configured to communicate with a host; a second interface configured to communicate with a first memory of the host, the first memory of the host configured to store a first data type; a controller, coupled to the first interface and the second interface, configured to issue commands to the first memory of the host; a second memory configured to store a second data type different from the first data type; a first data buffer coupled to the first interface and the second interface and configured to transfer data of the first data type between the first interface and the second interface; and a second data buffer, coupled to the second memory and the first interface and configured to transfer data of the second data type between the first interface and the second memory.

In some aspects of the above memory controller, the first data type is dynamic data.

In some aspects of the above memory controller, the second data type is static data.

In some aspects of the above memory controller, the first data buffer is a dynamic random-access memory (DRAM) buffer.

In some aspects of the above memory controller, the second data buffer is a static data buffer.

In some aspects of the above memory controller, the first memory is at least one of DRAM, high performance volatile memory, static random-access memory (SRAM), flash memory (FLASH), ferroelectric random-access memory (FRAM), resistive random-access memory (RRAM).

In some aspects of the above memory controller, the second memory is at least one of DRAM, flash memory, FRAM, RRAM, MRAM, a non-volatile, and a high-density memory.

In some aspects of the above memory controller, the communication associated with the first interface is a memory access channel type of one of double-data rate (DDRx), low-power double data rate (LPDDRx), graphics double data rate (GDDRx), high-bandwidth memory (HBM), and a high-speed memory access channel.

In some aspects of the above memory controller, the second interface is configured to couple to the first memory using through-silicon vias (TSVs).

In some aspects of the above memory controller, the second data buffer is in a cache structure.

In some aspects of the above memory controller, the host is at least one of a central processing unit (CPU), a graphics processing unit (GPU), a field-programmable gate array (FPGA), a digital signal processor (DSP), an accelerator integrated circuit (IC), an application-specific integrated circuit (ASIC), and a processor.

In some aspects of the above memory controller, the second data type is defined by the host.

In some aspects of the above memory controller, the first memory and the second memory are located on a same die.

In some aspects of the above memory controller, the first interface further includes: an address mapping block configured to map a first memory address to a second memory address associated with a first address mapping; and a wear-leveling circuit configured to update the first address mapping to a second address mapping, wherein the memory controller is configured to access the second memory address in response to receiving a request to access data at the first memory address.

In some aspects of the above memory controller, the wear-leveling circuit is configured to map the first memory address to a third memory address associated with the second address mapping in response to receiving a request to update the address mapping.

In some aspects of the above memory controller, the first memory address is associated with the first data type, and the second memory address is associated with the second data type.

In some aspects of the above memory controller, the controller and the first data buffer are integrated as a single element.

In some aspects of the above memory controller, the memory controller is included in one selected from an edge-AI system, a neural-network system, an internet-of-things system, an automotive electronics system, microcontroller system, a mobile communication system, a programmable computing system, a hardware security system, a telematics system, a biomedical electronics device, a robot, and a drone.

In one aspect, a computing system includes: a first memory; a host; and any of the above memory controllers coupled to the first memory and the host.

In one aspect, a method includes: receiving, by a memory controller, a request for data access; determining a data type associated with the data being accessed; in accordance with a determination that the data is a first data type, accessing, using the memory controller, a first memory; and in accordance with a determination that the data is a second data type, accessing a second memory of the memory controller.

In some aspects of the above method, the memory controller is any of the above memory controllers.

In one aspect, a method includes operating a memory in a first mode, the first mode comprising at least one of a page mode, a random-access mode, and a streaming mode; receiving, while operating in the first mode, an input to change the operation of the memory to a second mode different from the first mode, the second mode comprising at least one of the page mode, the random-access mode, and the streaming mode; and in response to receiving the input to change the operation of the memory from the first mode to the second mode, operating the memory in the second mode.

In some aspects of the above method, the first mode comprises a page mode having a first page size of the memory, and the second mode comprises a page mode having a second page size of the memory.

In some aspects of the above methods, the method further includes storing information associated the page size and parameters associated with the page size in a register or a non-volatile memory of the memory.

In some aspects of the above methods, the method further includes: outputting data from the memory; and storing the data in a secondary data buffer. The secondary data buffer is configured as: a page buffer when the memory is in the page mode, a cache when the memory is in the random-access mode, and a first-in-first-out data buffer when the memory is in the streaming mode.

In some aspects of the above methods, when the memory is operating in the random-access mode, the method further includes accessing a data word having a programmable size.

In some aspects of the above methods, when the memory is operating in the streaming mode, the method further comprises accessing the memory using a programmable address sequence associated with a data stream.

In some aspects of the above methods, the method further includes storing the address sequence in a non-volatile memory of the memory.

In some aspects of the above methods, the method includes receiving a first address associated with a requested data stored in the memory; and accessing the memory at a second address. The requested data is stored at the second address of the memory, and the received first address is mapped to the second address of the memory.

In some aspects of the above methods, the method includes mapping the first address to the second address based on a usage pattern of the memory.

In some aspects of the above methods, the memory comprises at least one of magneto-resistive random-access memory (MRAM), dynamic random-access memory (DRAM), static random-access memory (SRAM), resistive random-access memory (RRAM), ferroelectric random-access memory (FRAM), flash memory, and phase-change memory (PCM).

In some aspects of the above methods, the input to change the operation of the memory from the first mode to the second mode is based on a usage pattern of the memory.

In some aspects of the above methods, the input to change the operation of the memory from the first mode to the second mode is determined by the memory.

In some aspects of the above methods, the method further includes: when the memory is operating in the page mode: receiving a column command; and in response to receiving the column command, accessing data words associated with the column command on an activated page.

In some aspects of the above methods, the method further includes prefetching data words prior to receiving a column command associated with the data words.

In some aspects of the above methods, locations of the prefetched data words are at least one of predetermined by a host accessing the memory, programmed by the host, and stored in a non-volatile memory of the memory.

In some aspects of the above methods, locations of the prefetched data words are determined by the memory.

In some aspects of the above methods, the data words are prefetched when the memory is in the page mode or the random-access mode.

In one aspect, a memory is configured to perform any of the above methods.

In some aspects of the above memory, the memory is included in one selected from an edge-AI system, a neural-network system, an internet-of-things system, an automotive electronics system, microcontroller system, a mobile communication system, a programmable computing system, a hardware security system, a telematics system, a biomedical electronics device, a robot, and a drone.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A method of accessing a memory, comprising:
   accessing a word line of a memory array;
   while accessing the word line of the memory array:
      accessing a first bit line corresponding to a sense amplifier;
      sampling and holding a first developed voltage associated with a state of a first memory bitcell at the word line and the first bit line;
      accessing a second bit line corresponding to the sense amplifier; and sampling and holding a second developed voltage associated with a state of a second memory bitcell at the word line and the second bit line;
providing, to the sense amplifier, the held first developed voltage;
generating a reference voltage;
sensing, with the sense amplifier, the held first developed voltage, wherein:
the second bit line is accessed while the held first developed voltage is sensed, and
sensing the held first developed voltage comprises amplifying a difference between the held first developed voltage and the reference voltage;
providing, to the sense amplifier, the held second developed voltage; and
sensing, with the sense amplifier, the held second developed voltage, wherein sensing the held second developed voltage comprises amplifying a difference between the held second developed voltage and the reference voltage.

2. The method of claim 1, wherein accessing the second bit line comprises accessing the second bit line while accessing the first bit line.

3. The method of claim 1, further comprising:
generating, based on the sensed held first developed voltage, a first data output associated with the state of the first memory bitcell; and
storing the first data output in a data buffer.

4. The method of claim 3, further comprising:
generating, based on the sensed held second developed voltage, a second data output associated with the state of the second memory bitcell; and
storing the second data output in the data buffer,
wherein a time difference between the storage of the first data output and the storage of the second data output is a delay between the sensing of the held first developed voltage and the sensing of the held second developed voltage.

5. The method of claim 3, wherein:
the word line and the first bit line are at a first address of the memory array, and the method further comprises:
receiving a memory address;
determining whether the memory address is the first address;
in accordance with a determination that the memory address is the first address, outputting the first data output from the data buffer; and
in accordance with a determination that the memory address is not the first address, forgoing outputting the first data output from the data buffer.

6. The method of claim 5, wherein storing the first output in the data buffer comprises latching the first data output in the data buffer, and the method further comprises in response to latching the first data output, designating the first data output as ready, wherein outputting the first data output from the data buffer is further in accordance with a determination that the first data output is designated as ready.

7. The method of claim 1, wherein:
the word line and the first bit line are at a first address of the memory array, and the method further comprises:
receiving a memory address;
determining whether the memory address is a second address, different from the first address;
in accordance with a determination that the memory address is the second address, updating an order of bit line access; and
in accordance with a determination that the memory address is not the second address, forgoing updating the order of bit line access,
wherein:
the second bit line corresponding to the sense amplifier is accessed in response to the updating of the order of bit line access, and
the second address is at the word line and the second bit line of the memory array.

8. The method of claim 1, further comprising:
stopping generation of the reference voltage; and
holding the reference voltage until sensing of the held first developed voltage and the held second developed voltage is completed.

9. The method of claim 1, wherein the first and second memory bitcells are one of magnetoresistive random-access memory (MRAM) bitcells, dynamic random-access memory (DRAM), static random-access memory (SRAM), resistive random-access memory (RRAM), ferroelectric random-access memory (FRAM), flash memory, and phase-change memory (PCM).

10. The method of claim 1, wherein the memory is operating in a page mode, the method further comprising:
switching the operation of the memory from the page mode to a random access mode;
accessing a second word line of the memory array; and
while accessing the second word line of the memory array:
accessing a third bit line corresponding to the sense amplifier; and
forgoing accessing other bit lines corresponding to the sense amplifier.

11. A memory system, comprising:
a sense amplifier; and
a memory array comprising:
a word line;
a first bit line corresponding to the sense amplifier;
a second bit line corresponding to the sense amplifier;
a first memory bitcell at the word line and the first bit line; and
a second memory bitcell at the word line and the second bit line, wherein the memory system is configured to:
access the word line;
while accessing the word line:
access the first bit line;
sample and hold a first developed voltage associated with a state of the first memory bitcell;
access the second bit line; and
sample and hold a second developed voltage associated with a state of the second memory bitcell;
provide, to the sense amplifier, the held first developed voltage;
generate a reference voltage;
sense, with the sense amplifier, the held first developed voltage, wherein:
the second bit line is accessed while the held first developed voltage is sensed, and
sensing the held first developed voltage comprises amplifying a difference between the held first developed voltage and the reference voltage;
provide, to the sense amplifier, the held second developed voltage; and
sense, with the sense amplifier, the held second developed voltage, wherein sensing the held second developed voltage comprises amplifying a difference between the held second developed voltage and the reference voltage.

\* \* \* \* \*